(12) United States Patent
Charache et al.

(10) Patent No.: US 7,889,776 B2
(45) Date of Patent: Feb. 15, 2011

(54) HIGH-POWER SEMICONDUCTOR LASER

(75) Inventors: Greg Charache, East Windsor, NJ (US); John Charles Connolly, Clarksburg, NJ (US); Holger Schlüter, Princeton, NJ (US); Claus Schnitzler, Kreuzau (DE)

(73) Assignee: Trumpf Photonics Inc., Cranbury, NJ (US)

( * ) Notice: Subject to any disclaimer, the term of this patent is extended or adjusted under 35 U.S.C. 154(b) by 840 days.

(21) Appl. No.: 10/597,300

(22) PCT Filed: Jan. 21, 2005

(86) PCT No.: PCT/US2005/001891

§ 371 (c)(1),
(2), (4) Date: Mar. 29, 2007

(87) PCT Pub. No.: WO2006/025849

PCT Pub. Date: Mar. 9, 2006

(65) Prior Publication Data

US 2008/0253421 A1      Oct. 16, 2008

Related U.S. Application Data

(60) Provisional application No. 60/573,406, filed on May 24, 2004, provisional application No. 60/481,924, filed on Jan. 20, 2004.

(51) Int. Cl.
*H01S 3/08*    (2006.01)
(52) U.S. Cl. ............................ 372/102; 372/92; 372/98; 372/99
(58) Field of Classification Search .................. 372/102, 372/92, 98–99
See application file for complete search history.

(56) References Cited

U.S. PATENT DOCUMENTS

| | | | |
|---|---|---|---|
| 4,013,338 A | 3/1977 | Sato et al. | |
| 4,057,408 A | 11/1977 | Pierson et al. | |
| 4,095,875 A | 6/1978 | Lee et al. | |
| 4,514,053 A | 4/1985 | Borrelli et al. | |
| 4,714,902 A | 12/1987 | Rokni et al. | |
| 4,834,474 A | 5/1989 | George et al. | |
| 4,942,102 A | 7/1990 | Keys et al. | |
| 4,995,050 A | 2/1991 | Waarts et al. | |
| 5,020,153 A | 5/1991 | Choa et al. | |
| 5,043,991 A | 8/1991 | Bradley | |
| 5,115,338 A | 5/1992 | DiGiovanni et al. | |
| 5,115,444 A * | 5/1992 | Kirkby et al. ............ | 372/50.22 |
| 5,185,754 A | 2/1993 | Craig et al. | |
| 5,319,668 A | 6/1994 | Luecke | |
| 5,335,098 A | 8/1994 | Leyva et al. | |
| 5,337,328 A | 8/1994 | Lang et al. | |
| 5,365,541 A | 11/1994 | Bullock | |
| 5,386,426 A * | 1/1995 | Stephens ................... | 372/20 |
| 5,392,308 A | 2/1995 | Welch et al. | |
| 5,440,669 A | 8/1995 | Rakuljic et al. | |
| 5,491,570 A | 2/1996 | Rakuljic et al. | |
| 5,499,261 A | 3/1996 | Welch et al. | |
| 5,537,432 A | 7/1996 | Mehuys et al. | |
| 5,592,503 A | 1/1997 | Welch et al. | |
| 5,602,864 A | 2/1997 | Welch et al. | |
| 5,629,954 A | 5/1997 | Jansen et al. | |
| 5,651,018 A | 7/1997 | Mehuys et al. | |
| 5,684,611 A | 11/1997 | Rakuljic et al. | |
| 5,684,900 A | 11/1997 | Nishiwaki et al. | |
| 5,691,989 A | 11/1997 | Rakuljic et al. | |
| 5,754,574 A | 5/1998 | Lofthouse-Zeis et al. | |
| 5,773,345 A * | 6/1998 | Ota ........................... | 438/286 |
| 5,777,763 A | 7/1998 | Tomlinson et al. | |
| 5,793,784 A | 8/1998 | Wagshul et al. | |
| 5,796,096 A | 8/1998 | Rakuljic et al. | |
| 5,798,859 A | 8/1998 | Colbourne et al. | |
| 5,818,614 A | 10/1998 | Nicolas et al. | |
| 5,825,792 A | 10/1998 | Villeneuve et al. | |
| 5,838,712 A | 11/1998 | Kraenert et al. | |
| 5,870,417 A | 2/1999 | Verdiell et al. | |
| 6,125,222 A | 9/2000 | Anthon | |
| 6,192,062 B1 | 2/2001 | Sanchez-Rubio et al. | |
| 6,198,759 B1 | 3/2001 | Broderick et al. | |
| 6,208,679 B1 | 3/2001 | Sanchez-Rubio et al. | |

(Continued)

FOREIGN PATENT DOCUMENTS

EP    0 310 438    4/1989

(Continued)

OTHER PUBLICATIONS

Mills et al., "Single-Mode Operation of 1·55µm Semiconductor Lasers using a Volume Holographic Grating", Electronics Letters, Jul. 18, 1985, vol. 21, No. 15, pp. 648-649.

(Continued)

*Primary Examiner*—Minsun Harvey
*Assistant Examiner*—Phillip Nguyen
(74) *Attorney, Agent, or Firm*—Fish & Richardson P.C.

(57)    ABSTRACT

A light source includes a semiconductor laser diode and a narrow spectral and spatial bandwidth reflector in optical communication with respect to the semiconductor diode laser and aligned with the output beam of the diode laser, such that a portion of the light in the output beam is reflected back into the laser.

7 Claims, 22 Drawing Sheets

U.S. PATENT DOCUMENTS

| | | | |
|---|---|---|---|
| 6,215,801 | B1 | 4/2001 | Ackerman et al. |
| 6,233,259 | B1 | 5/2001 | Ventrudo et al. |
| 6,269,203 | B1 | 7/2001 | Davies et al. |
| RE37,354 | E | 9/2001 | Welch et al. |
| 6,292,498 | B1 | 9/2001 | Pfaff |
| 6,327,292 | B1 | 12/2001 | Sanchez-Rubio et al. |
| 6,330,257 | B1 | 12/2001 | Major, Jr. et al. |
| 6,363,092 | B1 | 3/2002 | Botez et al. |
| 6,363,097 | B1 | 3/2002 | Linke et al. |
| 6,455,341 | B1 | 9/2002 | Macomber |
| 6,529,542 | B1 | 3/2003 | Karlsen et al. |
| 6,586,141 | B1 | 7/2003 | Efimov et al. |
| 6,673,497 | B2 | 1/2004 | Efimov et al. |
| 6,693,925 | B2 * | 2/2004 | Hoose et al. .................... 372/6 |
| 6,704,343 | B2 * | 3/2004 | Deng et al. .................... 372/97 |
| 6,760,513 | B1 * | 7/2004 | Heitmann et al. ............. 385/27 |
| 7,031,573 | B2 | 4/2006 | Volodin et al. |
| 7,125,632 | B2 | 10/2006 | Volodin et al. |
| 7,177,340 | B2 | 2/2007 | Lang et al. |
| 7,212,554 | B2 | 5/2007 | Zucker et al. |
| 7,248,617 | B2 | 7/2007 | Volodin et al. |
| 7,248,618 | B2 | 7/2007 | Volodin et al. |
| 7,273,683 | B2 | 9/2007 | Volodin et al. |
| 7,298,771 | B2 | 11/2007 | Volodin et al. |
| 7,326,500 | B1 | 2/2008 | Glebov et al. |
| 2004/0013156 | A1 | 1/2004 | Deng et al. |
| 2004/0013157 | A1 | 1/2004 | Deng et al. |
| 2004/0042522 | A1 * | 3/2004 | Sutter et al. .................... 372/70 |
| 2005/0008058 | A1 * | 1/2005 | Thornton ...................... 372/97 |
| 2005/0018743 | A1 * | 1/2005 | Volodin et al. .............. 372/102 |
| 2005/0031264 | A1 | 2/2005 | Volodin et al. |
| 2005/0207466 | A1 | 9/2005 | Glebov et al. |
| 2005/0244102 | A1 | 11/2005 | Volodin et al. |
| 2005/0265657 | A1 | 12/2005 | Volodin et al. |
| 2006/0215972 | A1 | 9/2006 | Volodin et al. |

FOREIGN PATENT DOCUMENTS

| | | |
|---|---|---|
| JP | 6242313 | 9/1994 |
| JP | 9502838 | 3/1997 |
| JP | 2002204025 | 7/2002 |
| JP | 2007527616 | 9/2007 |
| WO | 9508206 A1 | 3/1995 |
| WO | WO 01/41270 | 6/2001 |
| WO | 0148882 A1 | 7/2001 |
| WO | WO 03/045863 | 6/2003 |

OTHER PUBLICATIONS

Volodin et al., "Holographic Volume Bragg Gratings Stabilize Laser Diode Performance", Photonocs Spectra, Nov. 2003, pp. 68-73.

Bayram et al., "Operation of a single mode external-cavity laser diode array near 780 nm", Review of Scientific Instruments, vol. 73, No. 12, Dec. 2002, pp. 4169-4971.

Borgman et al., "Photothermal Refractive Effect in Silicate Glasses", Sov. Phys. Dokl., vol. 34, No. 11, pp. 1011-1013, 1989.

Braiman et al., "Synchronization of Arrays of High Power Lasers", Solid State and Diode Laser Technology Review, 2003, 4 pages.

Chann et al., "Frequency-narrowed external-cavity diode-laser-array bar", Optics Letters, vol. 25, No. 18, Sep. 15, 2000, pp. 1352-1354.

Ciapurin et al., "High-Power Incoherent Beam Combining with Bragg Grating in Photosensitive Glasses", Proc. Of Solid State and Diode Lasers Technical Review, Albuquerque, New Mexico, 2002.

Danue et al., "Spectral Beam Combining of a Broad-Stripe Diode Laser Array in an External Cavity", Massachusetts Institute of Technology, 2 pages, May 10, 2000.

Datta et al., "Modeling of Nonideal Volume Bragg Reflection Gratings in Photosensitive Glass Using a Perturbed Transmission Matrix Approach", IEEE Journal of Quantum Electronics, vol. 40, 2No. 5, May 2004, pp. 580-589.

Earles et al., "1.1W Continuous Wave Narrow Spectral Width (< 1Å) Emission from Broad Stripe Distributed Feedback Diode Lasers", Appl. Phys. Lett., vol. 73, pp. 2072-2074 , 1998.

Glebov, L.., "Volume Diffractive Elements in Photosensitive Inorganic Glass for Bean Combining", Conference Digest, Paper Code FA-5, Albuquerque, New Mexico, May 21-24, 2001.

Glebov, L., "Optimizing and Stabilizing Diode Laser Spectral Parameters", Photonics Spectra, University of Central Florida, 2 pages, Jan. 2005.

Kanskar et al., "Performance and Reliability of ARROW single Mode & 100µm Laser Diode and the Use of NAM in A1-free Lasers", SPIE 4995, presented at Photonics West, 2003, 13 pages.

Levron et al., "Magnetic Resonance Imaging of Hyperpolarized $^{129}$Xe Produced by Spin Exchange with Diode Laser Pumped Cs", Appl. Phys. Lett., vol. 73, pp. 2666-2668. 1998.

Liu et al., "Injection Locking of Individual Broad-Area Lasers in an Integrated High-Power Diode Array", Appl. Phys. Lett., vol. 81, No. 6, pp. 978-980, Aug. 5, 2002.

Liu et al., "Simultaneous Injection Locking of Couple of High-Power Broad-Area Lasers Driven by a Common Current Source", Applied Optics, vol. 41, No. 24, Aug. 20, 2002, pp. 5036-5039.

LuxxMaster™ Wavelength Stabilizer Elements for High Power Lasers and Laser Arrays, Brochure, PDLD, Inc., 2001.

Marciante et al., "Lateral Spatial Effects of Feedback in Gain-Guided and Broad-Area Semiconductor Lasers", IEEE Ji. Quantum Electron., vol. 32, pp. 1630-1635 , 1996.

Mizunami et al., "Bragg Gratings in Multimode and Few-Mode Optical Fibers", Jl. Lightwave Tech. Lett., vol. 18, pp. 230-235 , 2000.

Moser et al., "Volume Bragg Grating Devices", Massachusetts Institute of Technology, pp. 644-645, Mar. 28, 2003.

Nelson et al.,"Spin Exchanged Optical Pumping using a Frequency Narrowed High Power Diode Laser", Appl. Phys. Lett., vol. 76, pp. 1356-1358 , 2000.

Romalis, M.V., "Narrowing of High Power Diode Laser Arrays using Reflection Feedback from an Etalon", Appl. Phys. Lett., vol. 77, pp. 1080-1081, 2000.

Szkopek et al., "Novel Multimode Fiber for Narrow Band Bragg Gratings", IEEE Jl. Select., Topics in Quantum Electronics, vol. 7, pp. 425-433 , 2001.

Volodin et al., "Improvements of performance of High-Power Multimode Laser Diodes and Arrays Achieved by Use of Volume Bragg Grating™ Technology", Solid State and Diode Laser Technology Review, 2004, 19 pages.

Volodin et al., "Wavelength Stabilization and Spectrum Narrowing of High-Power Multimode Laser Diodes and Arrays by Use of Volume Bragg Gratings", Optical Society of America, vol. 29, issue 16, Aug. 2004, Abstract.

Volodin et al., "Applications of the Volume Bragg Grating™ Technology to High-Brightness Laser Diode Arrays", Solid State and Diode Laser Technology Review, 2005, 5 pages.

Yan et al., "Measurement of Diode Laser Characteristics Affecting Tunability with an External Grating", J. Opt. Soc. Am., vol. 9, No. 11, Nov. 1992, pp. 2122-2127.

Zheng et al., "Effective Bandwidth Reduction for a High-Power Laser-Diode Array by an External-Cavity Technique", Optics Letters, vol. 30, No. 18, Sep. 15, 2005, pp. 2424-2426.

Zhu et al., "Spectrally Narrowed External-Cavity High-Power Stack of Laser Diode Arrays", Optics Letters, vol. 30, No. 11, Jun. 1, 2005, pp. 1342-1344.

Supplementary Search Report from corresponding European Application No. 05 810 008.2-222, issued by the European Patent office on Feb. 21, 2008, 3 pages.

Communication from corresponding European Application No. 05 810 008.2-222, issued by the European Patent office on May 13, 2008, 5 pages.

Daneu et al., "Spectral Beam Combining of a Broad-Stripe Diode Laser Array in an External Cavity", Optics Letters, Mar. 15, 2000, vol. 25, No. 6, pp. 405-407.

Office Action from corresponding Japanese Application No. 2006-551287, mailed May 27, 2010, with English translation, 7 pages.

\* cited by examiner

HIGH-POWER SEMICONDUCTOR LASER

CLAIM OF PRIORITY

This application claims priority to U.S. Patent Application Ser. Nos. 60/573,406, filed on May 24, 2004, and 60/481,924, filed Jan. 20, 2004, which are both incorporated by reference in their entirety.

TECHNICAL FIELD

This invention relates to semiconductor lasers, and more particularly to a high-power semiconductor laser.

BACKGROUND

High-power diode lasers are used in many different applications. The usefulness of a laser for a specific application can be characterized by the laser's output power, the spectral line width of the output light, and the spatial beam quality of the output light. The spatial beam quality can be characterized in several ways. For example, a wavelength independent characterization of the spatial beam quality is provided by the beam parameter product ("BPP"), which is defined as the product of the beam waist, $\omega_o$, and the half far-field divergence angle of the beam, $\theta_o$, (i.e., BPP=$\omega_o\theta_o$). As another example, a dimensionless characterization of the spatial beam quality is provided by the beam quality factor, M or Q, where, $M^2=1/Q=\pi\omega_o\theta_o/\lambda$, with $\lambda$ being the wavelength of the output laser light.

Different applications require tailoring the laser's output power, spectral line width, and spatial beam quality in different ways that optimize system performance. For example, high power output from a semiconductor diode laser can be achieved using a relatively wide lateral width of the active material. Such devices may be known as "wide stripe emitters," broad stripe emitters," or "multimode devices." However, when the lateral width of the active material is greater than several times the laser output wavelength, gain can occur in higher order spatial modes of the resonant cavity, which can reduce the spatial beam quality of the output laser light. Multiple wide stripe emitters can be fabricated side-by-side on a single chip to a make an array of diode lasers. The output light of multiple individual diode lasers in an array can be combined incoherently to increase the overall output power from the chip. However, the quality of the combined output beam generally decreases with the number of individual emitters in an array.

SUMMARY

The output of a laser device is partially and selectively fed back into the device by an external reflector having a three-dimensional pattern of refractive index variations within the reflector. The reflectivity of the reflector can depend sensitively on the wavelength and direction of the light shined into the reflector. By using a reflector having an appropriate wavelength- and angular-reflectivity to provide the feedback, the spatial beam quality, Q, the spectral line width, $\Delta\lambda$, and the output power, P, of the laser device can be improved and stabilized for a particular application. At the same time, the output power of a laser device can be increased by increasing the emitter width, the number of emitters (e.g., in an array) that contribute to a single output beam, or the number of arrays (e.g., in a stack of arrays). When the beams of multiple emitters are combined the brilliance of the light source can be maintained. Thus, high power, narrow line width, high beam quality, and therefore high brilliance devices are possible. In addition, it is possible to optimize individual characteristics of the laser device (e.g., extremely narrow linewidth of output light) without adversely affecting other properties of the device (e.g., power and spatial beam quality), or it is possible to optimize two of the three properties (e.g., narrow line width and high power), while not adversely affecting the third property.

In a first general aspect, a light source includes a semiconductor diode laser, and a reflector having a three-dimensional pattern of refractive index variations within the reflector. The reflector is in optical communication with the semiconductor diode laser and is aligned with an output beam of the diode laser, such that a portion of the light in the output beam is reflected back into the laser by the reflector.

One or more of the following features can be included. For example, the reflector can be a volume diffractive grating, an interference filter, a photonic bandgap crystal, a volume Bragg grating, or a holographic grating. The diode laser can be a multimode diode laser when operated without the reflector. The reflector can be in contact with a facet of the diode laser. The reflector can have a peak reflectivity that is greater than a reflectivity of an output facet of the diode laser.

The reflectivity of the reflector and the reflectivity of the output and rear facets of the diode laser can be selected to optimize the output power of the light source. The reflectivity of the output facet is less than about 50%, less than 10%, or less than about 3%. The reflector can be in contract with a rear facet of the diode laser. The reflector can be adapted to focus the output beam from the diode laser along a fast axis of the diode laser or along a slow axis of the diode laser. The reflector can be adapted to enhance the gain of a desired lateral mode over the gain of other lateral modes to increase a brightness of the output beam. The reflector can be adapted to enhance optical feedback to the diode laser in a desired optical mode relative to undesired optical modes. The optical feedback from the reflector can spatially shape the output beam of the light source to have a square or Guassian profile.

The reflector can have a reflectivity spectral width that is less than 0.2 nm or less than 0.01 nm. The reflector can be adapted to provide selective feedback to the diode laser such that a single longitudinal mode is emitted from the light source. The reflector can be adapted and arranged relative to the diode laser to provide selective feedback to the diode laser such that the sidemode suppression ratio in the light source is greater than −30 dB. The diode laser and reflector can be configured in an ECL a configuration having a footprint of less than about one square centimeter.

The reflector can be adapted and arranged relative to the diode laser to provide selective feedback to injection lock the wavelength of the output beam from the diode laser. The diode laser and the reflector can be adapted and arranged in an external cavity configuration.

The light source can further include a lens positioned between the diode laser and the reflector. The lens can be adapted for focusing the output beam from the diode laser along a fast axis of the diode laser. The output beam of the diode laser can be substantially perpendicular to the pattern of refractive index variations.

The light source can include multiple diode lasers aligned with respect to the reflector such that a portion of the light emitted from each of the diode lasers is reflected back into the diode laser from which the light is emitted. The lasers can be arranged in an array on a single chip. The lasers can be arranged in multiple single-chip arrays, and wherein the arrays are stacked on top of each other.

The light source can further include a laser active medium that absorbs at least a portion of the output beam and is pumped by the output beam. The laser active medium can be an active medium of a rod laser, an active medium of a disk laser, or an active medium of a fiber laser.

In another general aspect, a light source includes a first semiconductor diode laser and a first reflector having a three-dimensional pattern of refractive index variations within the reflector. The first reflector is in optical communication with the first semiconductor diode laser and is aligned with an output beam of the first laser such that a portion of the output beam of the first laser is reflected back into the first laser by the first reflector. The light source further includes a second semiconductor diode laser and a second reflector. The second reflector has a three-dimensional pattern of refractive index variations within the reflector, and the second reflector is in optical communication with the second semiconductor diode laser and aligned with an output beam of the second laser such that a portion of the output beam of the second laser is reflected back into the second laser by the second reflector. The light source further includes a first beam combiner adapted and arranged for combining the output beams of the first laser and the second laser.

Implementations can include one or more of the following features. For example, the first beam combiner can be external to cavities formed by first diode laser and the first reflector and by the second diode laser and the second reflector. The first beam combiner can be a reflector having a three-dimensional pattern of refractive index variations within the reflector. The first beam combiner, the first diode laser, and the second diode laser can be arranged such that the beams are combined in parallel by the first beam combiner. The first beam combiner, the first diode laser, and the second diode laser can be arranged such that the beams are combined in series by the first beam combiner. The output beams of the first laser and the second laser can have different polarizations. The output beams of the first laser and the second laser can have different wavelengths or different polarizations. The first beam combiner, the first diode laser, and the second diode laser can be arranged such that the beams are combined geometrically.

The light source can further include a third semiconductor diode laser and a third reflector having a three-dimensional pattern of refractive index variations within the reflector, where the third reflector is in optical communication with the third semiconductor diode laser and aligned with an output beam of the third laser such that a portion of the output beam of the third laser is reflected back into the third laser by the third reflector, and a second beam combiner for combining the output beams of the first laser and the third laser in parallel.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

DESCRIPTION OF DRAWINGS

Like reference symbols in the various drawings indicate like elements.

DETAILED DESCRIPTION

A high-power semiconductor diode laser or diode laser array can be optically coupled to a narrow spectral and spatial bandwidth reflector to control the modes of the laser light generated in the laser, such that only desired modes are supported. The radiation reflected by the reflector back into the light source aids in discriminating undesired spatial and spectral modes, which stabilizes the laser light about the narrow spatial and spectral bandwidth. The apparatus and method can be used for many different material systems as well as all semiconductor diode laser sources for both discrete elements and laser arrays.

Figure 1:
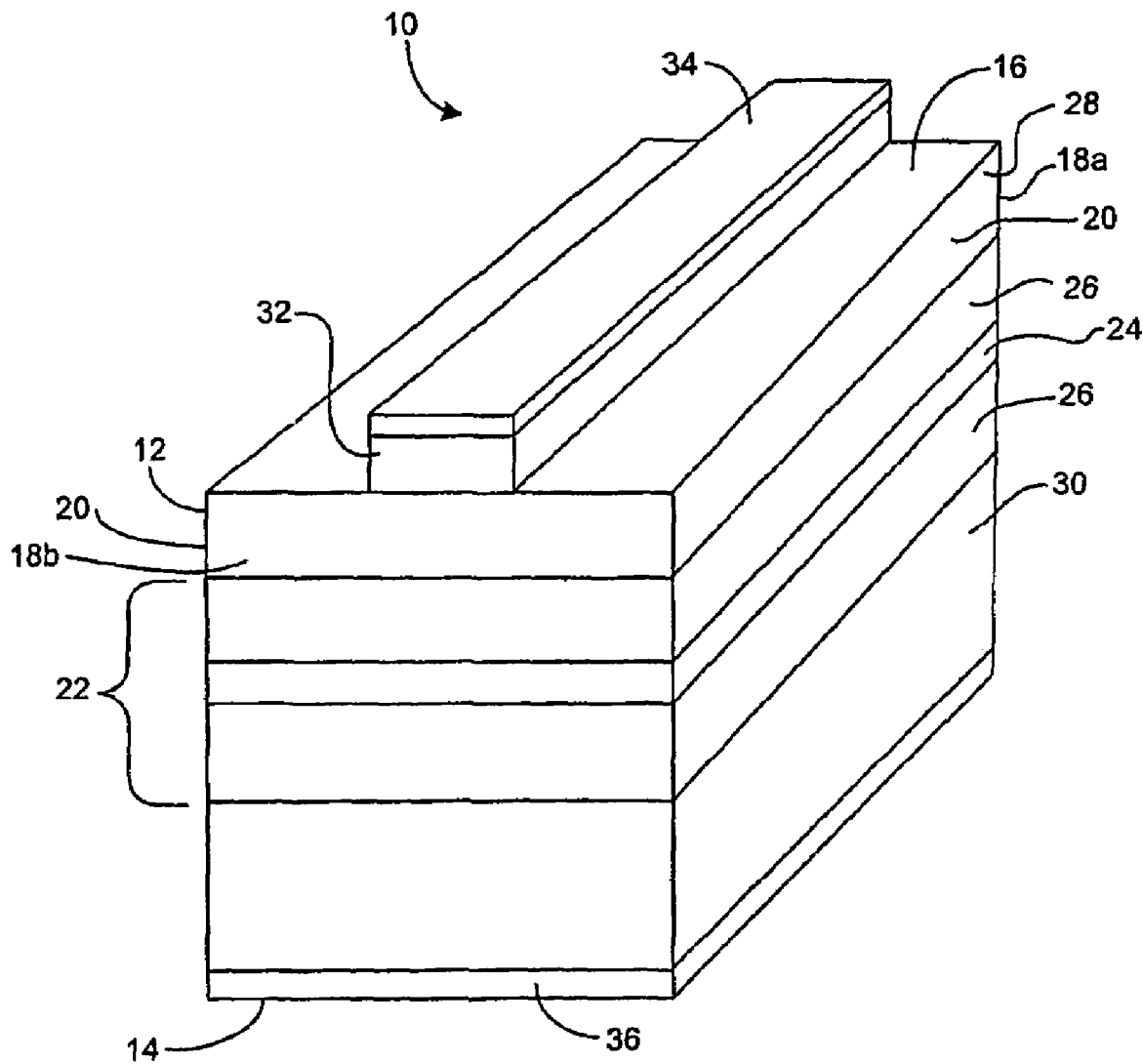
FIG. 1 is a schematic perspective view of a diode laser.

FIG. 1 shows a semiconductor diode laser 10 that includes a body 12 of semiconductor material or materials having a bottom surface 14, top surface 16, end surfaces 18, and side surfaces 20. Material layers within the body 12 can be grown epitaxially, e.g., through metal organic chemical vapor deposition (MOCVD), liquid phase epitaxy (LPE), or molecular beam epitaxy (MBE). Semiconductor body 12 includes a waveguide region 22 that extends across the length of the laser body 12. Within the waveguide region 22 is an active region 24 in which photons are generated when an appropriate electrical bias is placed across the diode 10. The active region 24 may be composed of any structure known in the diode laser art that is capable of generating photons. For example, the active region 24 can include one or more $In_xGa_{1-x}As_yP_{1-y}$ quantum wells, where $0 \leq x \leq 1$ and $0 \leq y \leq 1$. On each side of the waveguide region 22 is a separate clad region 28 and 30. The waveguide region 22 also includes waveguide layers 26 on each side of the active region 24 that are composed of semiconductor material having an index of refraction that is greater than the cladding layer's 28 and 30 index of refraction.

Also, the clad regions 28 and 30 are at least partially doped, such that they have opposite conductivity types. For example, the clad region 28 between the waveguide region 22 and the top surface 16 of the body 12 may be of p-type conductivity and the clad region 30 between the waveguide region 22 and the bottom surface 14 of the body 12 may be of n-type conductivity.

The various regions of the body 12 may be made of any of the well-known semiconductor materials used for making diode laser, such as, but not limited to, gallium arsenide, indium phosphide, aluminum gallium arsenide, indium gallium arsenide, indium gallium phosphide, and indium gallium arsenide phosphide. The individual compositions and thicknesses of the active region 24, the waveguide layers 22, and the clad regions 28 and 30 can be chosen such that the overlap of the vertical laser cavity mode over the waveguide region 22 is large (e.g., more than about 90%), as described in U.S. Pat. No. 5,818,860, which is incorporated herein by reference in its entirety. For example, the vertical thickness of the active region can be on the order of the a few nm, while the vertical thickness of the waveguide region 22 is on the order of the wavelength of the radiation emitted from the laser 10.

The body 12 can be fabricated such that the upper clad region 28 includes a ridge 32 that is in ohmic contact with a contact layer 34 of a conductive material, such as a metal. The contact layer 34 is in the form of a stripe that extends between the end surfaces 18 of the body 12 and is narrower than the width of the body 12, i.e., the distance between the side surfaces 20 of the body 12. The contact stripe may be normal to the emitting facets of the laser or be position at an angle to the emitting facets so as to reduce the reflectivity of the emitting facet. The stripe may also be of normal incidence for one emitting facet and at an angle for the other such that the contact forms a curved contact on the diode laser. For example, the width of the contact stripe can be equal to the width of the stripe. Alternatively, the body can be fabricated without a ridge 32, and a contact stripe 34 can be deposited on a flat top surface 16 of the body 12. A contact layer 36 of a conductive material, such as a metal, is on and in ohmic contact with the n-type conductivity clad region 30. The contact layer 36 extends across the entire area of the bottom surface 14 of the body 12.

End surfaces 18a and 18b of diode laser 10 can be totally or partially reflecting, such that when electromagnetic radiation generated in active region 24 reaches an end surface 18a or 18b it is reflected back into the active region, where it can cause the stimulated emission of additional radiation having the same, or nearly the same, wavelength and phase as the reflected radiation. For example, one end surface (e.g., a rear surface) 18a can have a reflectivity of about 95% and the other end surface (e.g., a front surface) 18b can have a reflectivity of about 0.1%-20%.

Figure 2:
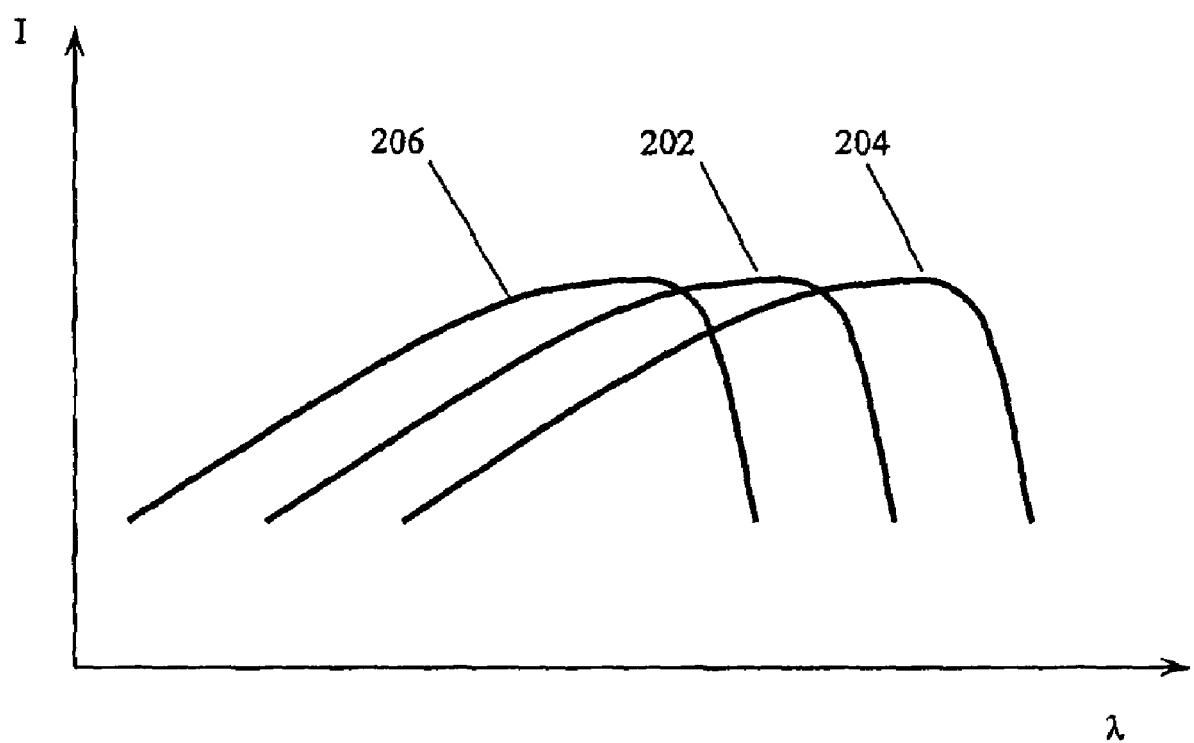
FIG. 2 is a graph of a spontaneous emission spectrum for a diode laser.

A hypothetical intensity (I) vs. wavelength ($\lambda$) spectrum 202 for spontaneously generated light in a diode laser 10 at a fixed temperature is shown in FIG. 2. The spectrum of spontaneously generated light depends on the material, width, and strain of the quantum well 24. However, the spectrum shown in FIG. 2 is temperature dependent, and spectra for the same diode laser 10 operating at a higher temperature 204 and a lower temperature 206 are also shown in FIG. 2. A change in diode laser 10 temperature can occur due to a change in ambient temperature, change in the thermal resistance of the heat sink, change in the heat generated within the diode laser due to increased current or reduced efficiency and by other means.

Radiation from a laser device is emitted into an optical mode of mode order N of a cavity that is defined by the geometry of body 12. When the rate of stimulated emission of radiation in the optical mode exceeds the radiation loss rate in the material, a threshold is exceeded above which gain occurs, and laser action begins in the optical mode of the body 12.

Figure 3:
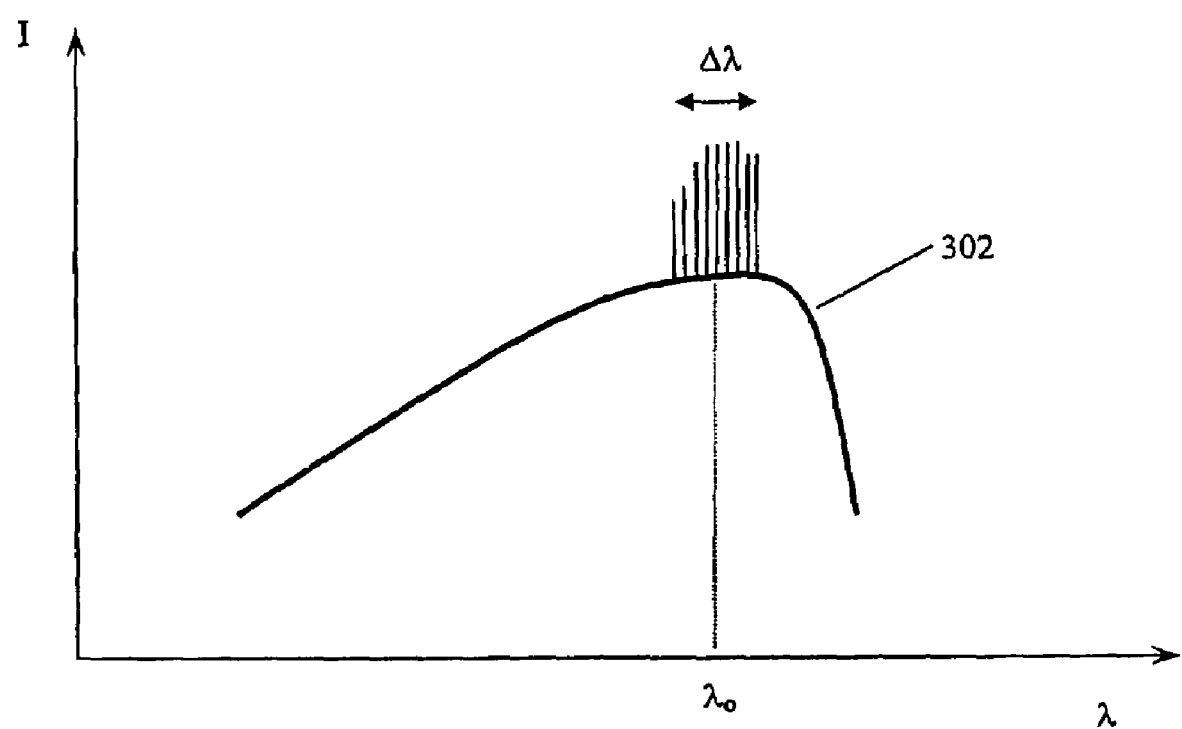
FIG. 3 is a graph of a spontaneous emission spectrum and a laser spectrum for a diode laser, illustrating the family of allowed longitudinal modes which is a function of cavity length.

As shown in FIG. 3, when the device 10 operates above threshold, the output radiation spectrum 302 resembles the spontaneous emission spectrum 202 for the device, with longitudinal modes 304 around a wavelength, $\lambda_o$, for which stimulated emission most strongly exceeds the loss. The peak wavelength, $\lambda_o$, is approximately equal to the wavelength at which the spectrum 202 reaches a maximum, and the full-width at half maximum (FWHM) spectral width, $\Delta\lambda$, of the longitudinal modes 304 is a few nm for a peak wavelength of about one micron. The spacing of the individual longitudinal modes is inversely proportional to the diode laser cavity length and is given by $\lambda_o^2/2n_{eff}L$, where $n_{eff}$ is the effective index of the mode and L is the cavity length. Thus, increasing the cavity length decreases mode spacing.

Non-radiative recombination in the body 12 causes an increase in the temperature of the diode laser, which can shift the spontaneous emission spectrum of the diode laser 10, which results in a shift in the center frequency of the output spectrum. Thermal aging of a diode laser 10 can also cause the peak wavelength, $\lambda_o$, at a fixed ambient temperature, to shift over the lifetime of the device. Stress induced in the diode laser by mounting, or thermally induced stress through different coefficients of expansion of the heat sink, the solder, and the diode laser material can also change the spontaneous emission spectrum as well as the laser emission wavelength.

A wider contact stripe 34 generally allows higher current flow, resulting in the generation of a greater number of photons per time and a higher output power from the laser 10. However, a wider contact stripe 34 also increases the number of lateral modes, N, in which laser action can occur, which results in a beam profile of the diode laser 10 that includes contributions from all of the above-threshold modes. A high-order mode output beam of the diode laser 10 has a beam quality that is lower than that of a low order mode beam (e.g., a Gaussian beam, having N=1), because the lowest order (i.e., N=1) mode has the highest beam quality (i.e., Q=1). Moreover, higher order modes generally co-exist and can compete in the beam profile, resulting in peaks and troughs in the spatial intensity spectrum of both the emitted laser light and the light that oscillates within the laser cavity.

When parameterizing a laser's performance in terms of the laser's output power, the spectral line width of the output light, and the spatial beam quality of the output light, it can be helpful to combine these performance characteristics into single parameter, namely the brilliance, B*, of the laser. The brilliance of a light source is defined as the number of photons emitted into a solid angle, $\partial\Theta$, per time, t, divided by the source area, $\delta A$, and wavelength interval, $\partial\lambda/\lambda$. Thus, $$B^* = \frac{N}{t \cdot \partial\Theta^2 \cdot \partial A \cdot (\partial\lambda/\lambda)}. \quad (1)$$

For a laser beam with a center $\lambda$, a beam waist radius $\omega_o$, and a far-field half divergence angle of $\theta_o$, $$B^* = \frac{P \cdot \lambda}{hc\pi^2\theta_0^2 \cdot \omega_0^2 \cdot (\partial\lambda/\lambda)}, \quad (2)$$

where h is Plank's constant and c is the speed of light. Using the dimensionless definition of the beam quality Q, $$Q = \frac{\lambda}{\pi\omega_0\theta_0}, \quad (3)$$

the brilliance can be written as $$B^* = \frac{P \cdot Q^2}{h \cdot c \cdot \Delta\lambda} \propto \frac{P \cdot Q^2}{\Delta\lambda}, \quad (4)$$

where P is the output power of the light source.

The brilliance of a light source (e.g., a laser) is considered a conserved quantity of the beam and cannot be increased by resonator-external, passive optical elements. Therefore, to improve the brilliance of a source it is important to improve the spatial beam quality, Q, and reduce the spectral width $\Delta\lambda$ of the output light.

Because the maximum beam quality (Q=1) is achieved by a Gaussian beam to profile, a Gaussian beam provides the maximum possible brilliance for a laser beam of given power and spectral width. A single-spatial mode laser exhibits maximum beam quality near unity since it operates with only Gaussian beam profiles. However, the maximum power that can be extracted from such a device is quite low, normally only about 0.5 W to 1 W. A multi-mode diode laser generally emits a beam having a nearly Gaussian profile in the vertical direction, also known as the fast axis of the laser. A multi-mode diode laser having a narrow stripe width on the order of the wavelength of the output light also emits a beam having a nearly Gaussian profile in the lateral direction, also known as the slow axis of the laser.

However, to achieve high power output from a semiconductor diode laser, a relatively wide effective lateral width of the active region is used to generate laser light. This can be accomplished, for example, by injecting current into the active region through a relatively wide contact stripe. The output power from laser depends approximately linearly on the width of the contract stripe. Ultimately, thermal limitations normally limit one's ability to expand the stripe width for increasing maximum power. The operating temperature of the active region can affect the reliability and efficiency of the laser, and the operating temperature depends on the thermal resistance of the laser. The thermal resistance of the laser is inversely proportional to the length multiplied by the effective width of the active region. Therefore wide effective area lasers can allow higher output powers at reasonable reliability (i.e., junction temperatures) than narrow devices.

Such lasers may be known as "wide stripe emitters," broad stripe emitters," or "multimode devices." However, when the effective lateral width of the active material is greater than several times the laser output wavelength, $\lambda_o$, gain can occur in higher order spatial modes of the resonant cavity, and the spatial beam quality, Q, of the output laser light can be reduced.

The beam emitted by wide stripe emitter is astigmatic and exhibits different beam qualities for the lateral (slow axis) and vertical (fast axis) directions. The overall beam quality can be defined as the product of the square root of the qualities for the two axes:

$$Q = \sqrt{Q_{Fast}} \cdot \sqrt{Q_{Slow}} = \frac{\lambda}{\pi \cdot \omega_0 \cdot \omega_0 \cdot \sqrt{N_{Fast}N_{Slow}}}, \quad (5)$$

where $Q_{Fast}$ and $Q_{Slow}$ refer to the beam quality in fast and slow axis, respectively, while $N_{Fast}$ and $N_{Slow}$ refer to the number of spatial modes in the fast and slow axis, respectively. The number of modes in the fast axis for laser is typically equal to unity. Therefore, the output beam in this direction is nearly Gaussian, and the beam quality in this direction nearly 1.

In the slow axis, the number of modes increases with increasing width, d, of the contract stripe. For wide contact stripes when many lateral modes exist, the number of modes can increase approximately linearly with width d. Thus, the slow axis beam quality can be written as $$Q_{Slow} = \frac{\lambda}{\pi \cdot \omega_0 \cdot \theta_0 \cdot \sqrt{N_{Slow}}} \cong \frac{\lambda}{\pi \cdot \omega_0 \cdot \theta_0 \cdot \sqrt{d}} \quad (6)$$

Because the slow axis beam quality depends inversely on the square root of the width of the contract stripe and the output power of the laser depends approximately linearly on the width of the contact stripe, increasing the power by increasing the stripe width d does not necessarily increase the brilliance, B*, as is evident from equation (4). To increase the brilliance of the laser, the slow axis beam quality must be maintained or improved as the power of the laser is increased.

Figure 4:
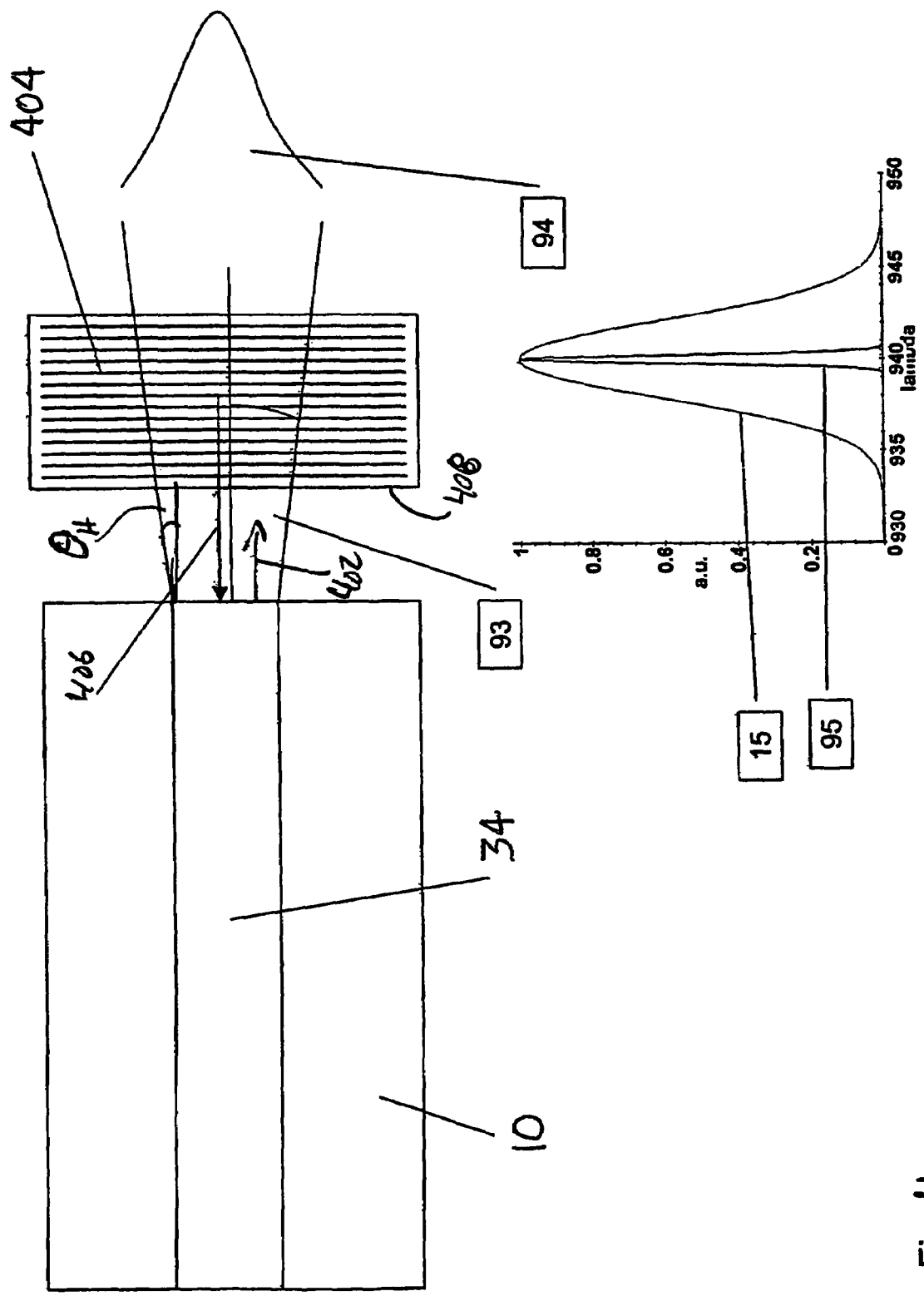
FIG. 4 is a schematic top view of a laser system, the lateral beam profile, and the output emission spectrum from the system.
Figure 5:
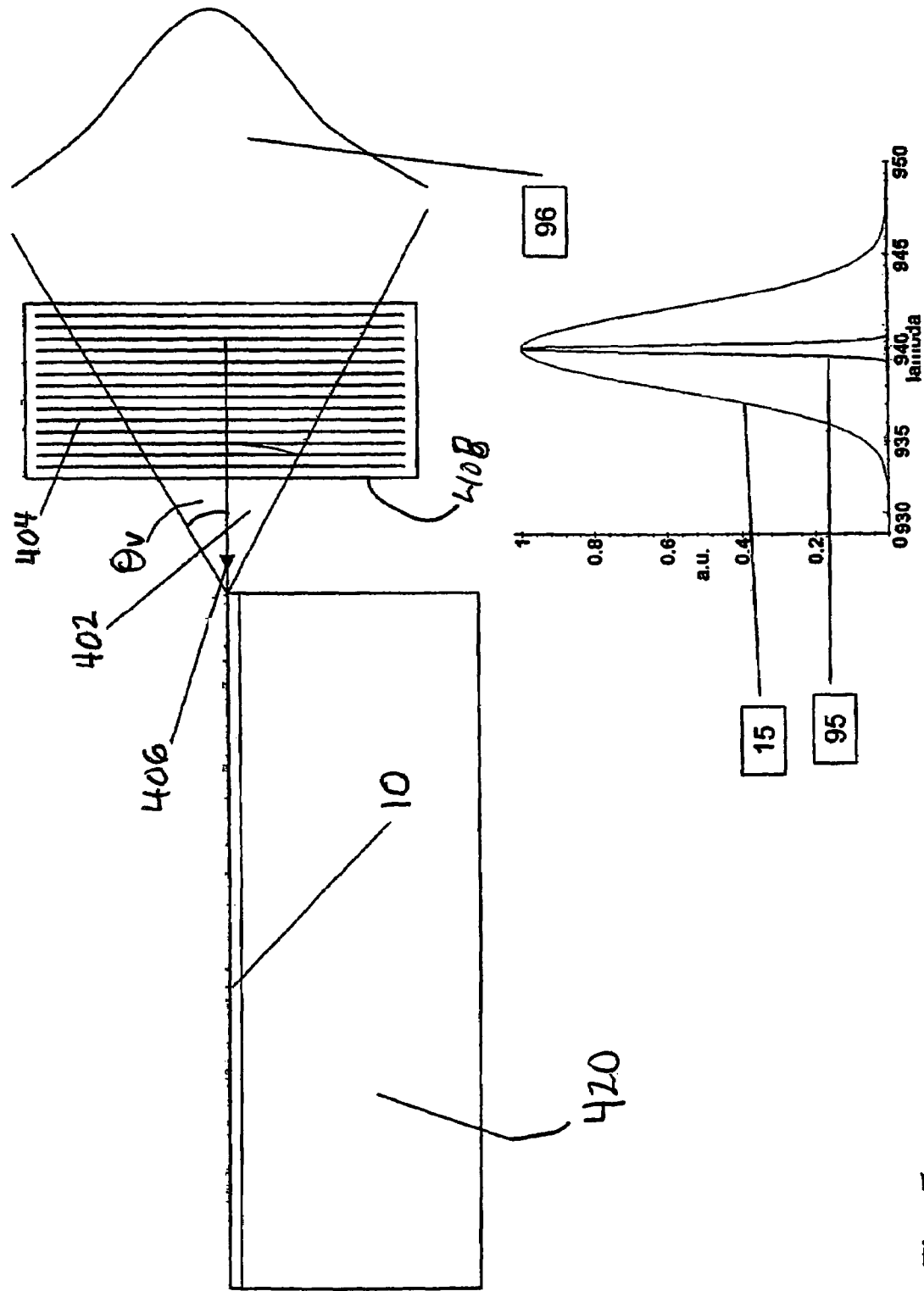
FIG. 5 is a schematic side view of a laser system, the vertical beam profile, and the output emission spectrum from the system.

As shown in FIG. 4 and FIG. 5, coupling the output beam 402 of a diode laser 10 mounted on a heat sink 420 to an three-dimensional external, narrow bandwidth reflector 404 can provide optical feedback 406 to the diode laser 10. Comparison of the horizontal divergence, $\theta_H$, and the vertical divergence, $\theta_V$, of the output beam 402, as illustrated in FIGS. 4 and 5, respectively, shows that the divergence is greater about the fast axis of the laser (i.e., in the vertical direction) than about the slow axis of the laser (i.e., in the horizontal direction). This is because the vertical thickness of the active layer 24 is much smaller than the layer's effective lateral width, which is determined, in part, by the width of the contact stripe 34. However, because the vertical thickness of the active region in the laser 10 is on the order of the output wavelength, only the lowest-order vertical cavity mode experiences gain in the laser 10, and the output beam 96 is diffraction limited in the vertical direction.

Figure 6A:
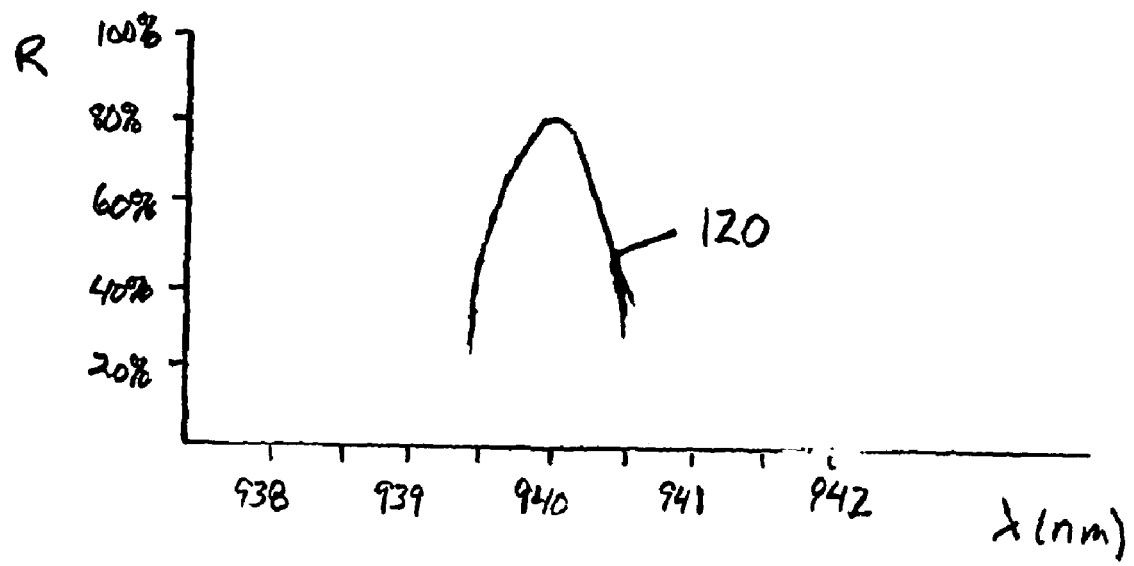
FIG. 6a is a spectral reflectivity spectrum of a reflector.

A narrow spectral bandwidth portion of the laser emission spectrum is partially reflected by reflector 404 back into the resonant cavity of the laser 10 where it self-seeds the laser, thus providing enhanced feedback to and stabilization of the laser over the narrow bandwidth of the reflector 404. The spectral reflectivity bandwidth of the reflector can be characterized by a peak reflectivity of about 1% to about 95% that is centered around the peak wavelength, $\lambda_p$, of the diode laser 10 and a FWHM reflectivity of about 0.01 nm to about 1.0 nm. For example, as shown in FIG. 6a, the spectral reflectivity spectrum 120 of the reflector 404 can have a profile that is has a peak of about 85% at a 940 nm and quickly decreases to higher and lower wavelengths, for instance to 50% of the peak value at 939.5 nm and 940.5 nm.

Figure 6B:
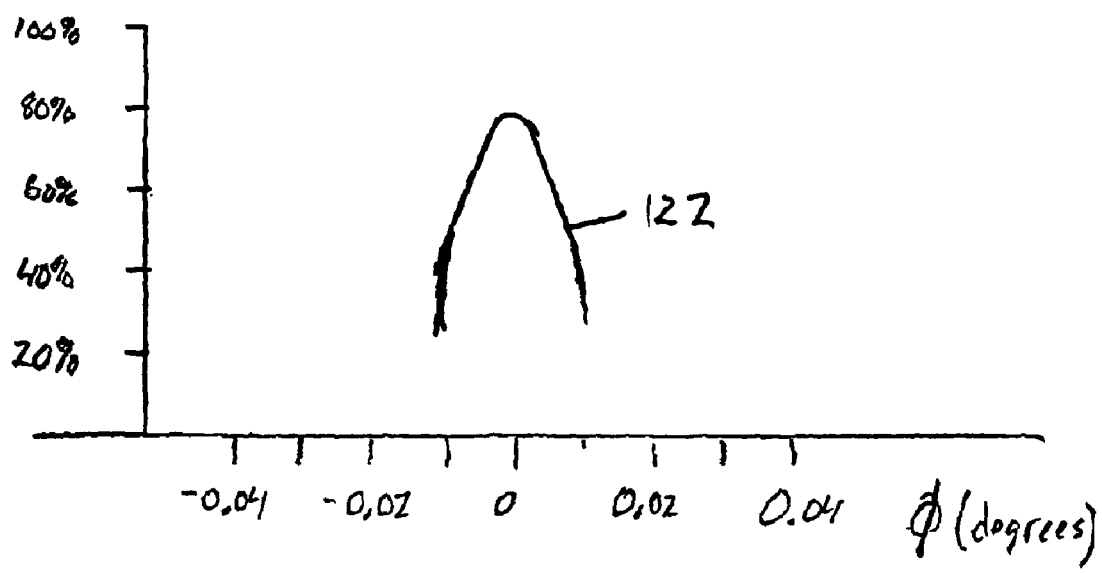
FIG. 6b is a spatial reflectivity spectrum of a reflector.

The reflectivity of the reflector 404 is similarly narrowly peaked about a particular input angle, $\phi_o$, of laser light with respect to an axis in the reflector (e.g., an axis that is normal to a front surface 408 of the reflector 404). The reflectivity of the reflector can have a peak reflectivity of about 5% to about 95% at $\phi_o$, which rapidly decreases at higher and lower angles, for example to 50% of the peak value at +/−0.01° centered around $\phi_o$. For example, as shown in FIG. 6b, the angular reflectivity spectrum 122 of the reflector 404 can be peaked about an angle of zero degrees to the normal of the front surface 408 of the reflector 404 and can have a FWHM width of about 0.02 degrees. Advantages of stabilizing the diode laser spectrum with feedback from the reflector 404 include: reduced temperature and current dependence of output wavelength; reduced epitaxial growth dependence of the output wavelength; improved spectral uniformity across multiple diode laser arrays optically coupled to the reflector 404; a narrowed spectral width output beam that can be used for various beam combining, spectroscopy, and solid state pumping applications.

High order modes in the lateral direction, with larger far field divergence at the given beam waist (i.e., given by the lateral width of the stripe 34) experience less feedback than low order modes. Therefore, the higher order modes are discriminated, and laser action does not occur in the higher order modes but only in the lower order modes. These effects can increase the brilliance of the output beam by increasing the beam quality, Q, and decreasing the spectral width, $\Delta\lambda$, without reducing the output power, P. In addition, advantages of stabilizing the lateral mode include: and increase of the catastrophic optical mirror damage ("COD") threshold, reduction of the effects of spatial hole burning in the active layer, stabilization of the lateral and/or vertical mode with drive current and temperature, a reduction of the far-field and near-field peak-to-valley variations, and an improvement in the coupling the output light to Guassian or square profiles.

The reflector 404 is a three-dimensional optical element that includes a three-dimensional pattern of index of refraction variations within the volume of the reflector 404. When light enters the reflector 404 it interacts with and is diffracted by the pattern of index of refraction variations. As a result of this interaction within the volume of the reflector 404, light can be reflected by the reflector.

The pattern of index of refraction variations can create, for example, a photonic bandgap crystal, a volume diffraction grating, a volume Bragg gratings (VBG), a holographic grating, or a interference filter.

Figure 6C:
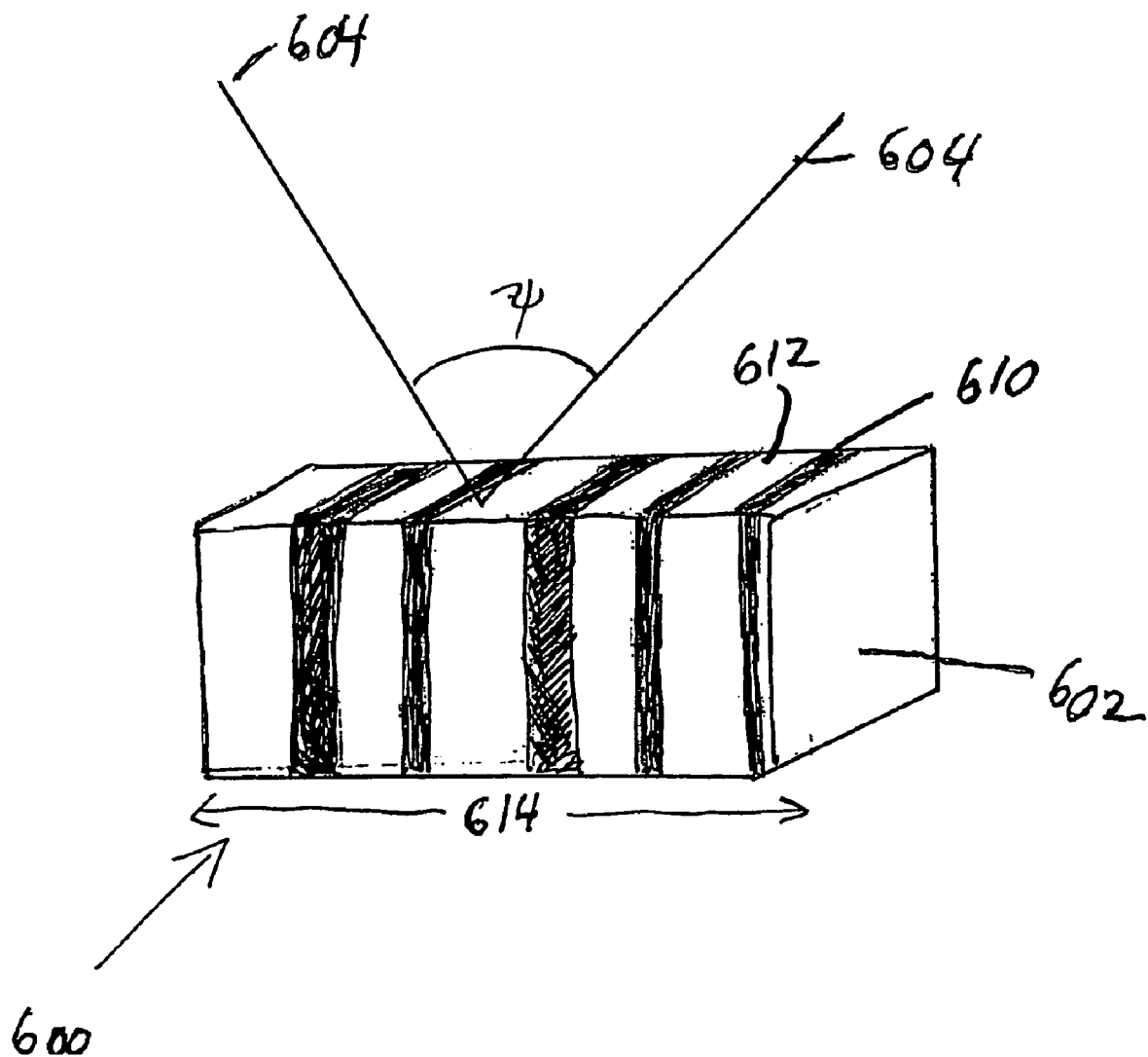
FIG. 6c is a schematic diagram of a photo-thermo-refractive material.

Referring to FIG. 6c, a volume diffraction grating or a volume Bragg grating 600 can be created by exposing a photo-thermo-refractive (PTR) material 602 to a periodic light intensity pattern to write the refractive index pattern into the material 602. The periodic light intensity pattern can be recorded in the material 602, for example, by interfering two monochromatic, coherent light beams 604 in the material.

The creation of volume diffractive gratings and the photosensitive materials used for the gratings have been described in "High-Power Incoherent Beam Combining with Bragg Grating in Photosensitive Glasses," by Igor V. Ciapurin, Leonid B. Glebov and Martin Stickley, Proceedings of Solid State and Diode Lasers Technical Review, Albuquerque, N. Mex. (2002), HPFIB4, and "Volume diffractive elements in photosensitive inorganic glass for beam combining," by L. B. Glebov, SSDLTR'2001 Conference Digest, Paper Code FA-5, Albuquerque, N. Mex., May 21-24, 2001, which are both incorporated herein by reference in their entirety.

The PTR material 602 can be, for example, a sodium-zinc-aluminum silicate doped with cerium, silver, and fluorine. A grating can be recorded in the material 602 by first exposing the material to an interference pattern of two or more ultraviolet lasers (e.g., 35 mW He—Cd lasers having a wavelength of 325 nm), which creates an interference pattern in the intensity of the ultraviolet (UV) radiation within the material. After exposure to the UV radiation, the material 602 is developed thermally to induce a crystal phase precipitation of the exposed UV pattern in the material. A refractive index contrast of up to about 0.001 between high-index portions 610 and low-index portions 612 of material 602 can be achieved in this manner.

The angle, $\Psi$, between the two beams 604 determines the spacing between the high-index portions 610 and low-index portions 612 of material 602. Volume diffractive gratings can be created that have a thickness 614 of up to 5 mm and a cross section that is much greater than the cross section of the output beam from the laser 10. For example, the cross section of the volume diffractive grating can be 10 mm by 10 mm. The spacing of the high-index portions 610 and the low-index low index portions 612 determines the wavelength of peak reflectivity for the reflector 404, and thickness of the material 614 and the repeatability of the high-index to low-index spacing over the thickness of the material determines the FWHM of the reflectivity spectrum 120. The peak reflectivity value of the reflector is determined by the refractive index contrast in the volume diffraction grating 600 and the thickness 614 of the gating.

Holographic grating reflectors 404 can similarly be created by interfering multiple beams within a photosensitive material to cause a pattern of index of refraction variations within the material. However, in a holographic grating the pattern need not consist of planes of material having different indices of refraction, and the pattern can include variations of the index of refraction that occur along different axes within the volume of the reflector 404.

A photonic bandgap crystal reflector 404 also can include variations of the index of refraction that occur along different axes within the volume of the material. Such crystals can be created by selective etching of the reflector 404, for example, to create a pattern of holes in a surface of a facet of the reflector 404, or by self-assembly of a crystal or crystalline structure having a pattern of variations of the index of refraction within its volume.

An interference filter reflector 404 can be created by sequentially depositing multiple layers of material having different indices of refraction to create a film that function as a reflector of light based on the interaction of the light with the multiple layers within the volume of the film.

Referring again to FIG. 4, the reflector 404 can be placed in front of the front end surface 18b of laser 10, such that light emitted from the laser 10 can be reflected by the reflector 404 back into the active region 24 of laser 10. When a volume diffraction grating is used as the reflector 404, light emitted from the laser 10 enters the grating at an angle that is, on average, perpendicular to the faces of the high-index portions 610 and low-index portions 612 of the grating pattern. Alternatively, light emitted from the laser 10 can enter the grating in a direction that is parallel to the grating pattern. Rather than being reflected by an interaction with the surface of the grating, light is reflected by the reflector due to the refractive index pattern within the volume of the three-dimensional reflector. The alignment tolerance of the reflector 404 depends, in part, on the reflectivity of the front end surface 18b and on the reflectivity at normal incidence of the reflector 404. In particular, the effective reflectivity of the reflector 404 (the fraction of the incident power that is coupled back into the semiconductor active area 24) should be greater than the reflectivity of the front end surface 18b to discriminate spatial and spectral modes.

Because the feedback 406 into the laser 10 is highly selective in the angular and the spectral emission spectra, the reflector 404 effectively discriminates higher order spatial modes and higher order spectral modes from the laser beam 94 that is ultimately emitted from the diode laser 10 and reflector 404 system. For example, modes with significant on-axis intensity are reflected most strongly by the reflector 404 and experience feedback and gain in the laser-reflector system, whereas higher-order modes having relatively little on axis intensity are reflected relatively less by the peak reflectivity of the reflector 404, and therefore experience less feedback and more loss than gain in the system.

Thus, the number of spatial modes, N, in the slow axis intensity profile 94 of the output beam can be substantially reduced when the reflector 404 is present. This reduces the divergence angle 93 of the output beam as compared with the divergence of the output beam of the laser 10 operated without the narrow band reflector 10, because the beam waist remains constant. This effectively increases the beam quality and brightness of the output beam 94.

Figure 7:
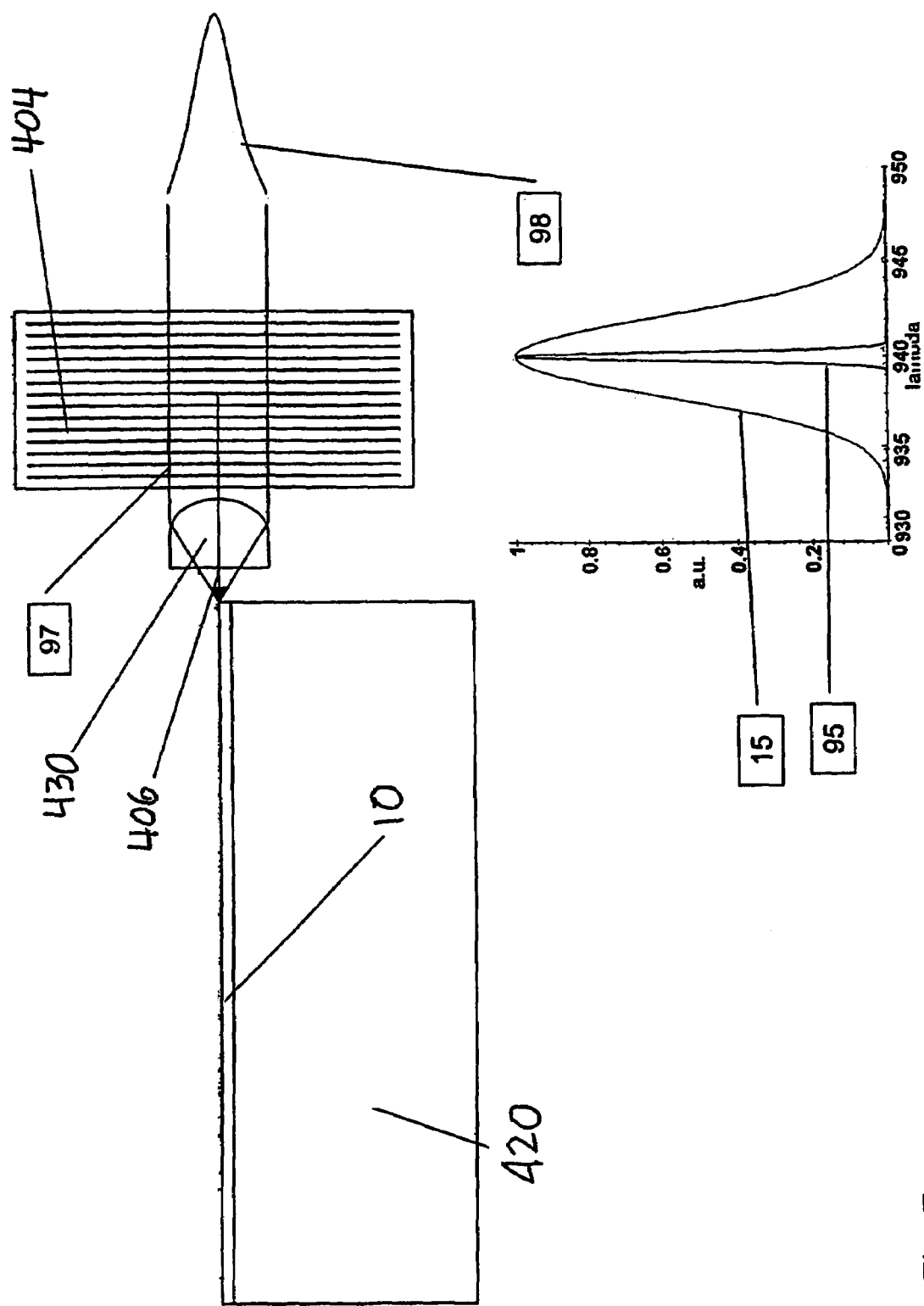
FIG. 7 is a schematic side view of a laser system, the vertical beam profile, and the output emission spectrum from the system.

As explained above, because only the lowest-order vertical cavity mode resonates in the laser cavity and the output beam is close to being diffraction limited in the fast axis, spatial modes are not discriminated in the fast axis direction, and the fast axis divergence is relatively unaffected by the presence of the narrow band reflector 404. However, as shown in FIG. 7, the output beam 98 can be focused in the fast axis direction by a cylindrical lens 430 located between the laser 10 and the narrow bandwidth reflector 404, so that the beam is collimated 97 in the fast axis. This increases the amount of feedback from the reflector 404 and reduces the frequency distribution of the reflected wave since only on axis light is present, which improves the mode discrimination.

Figure 8:
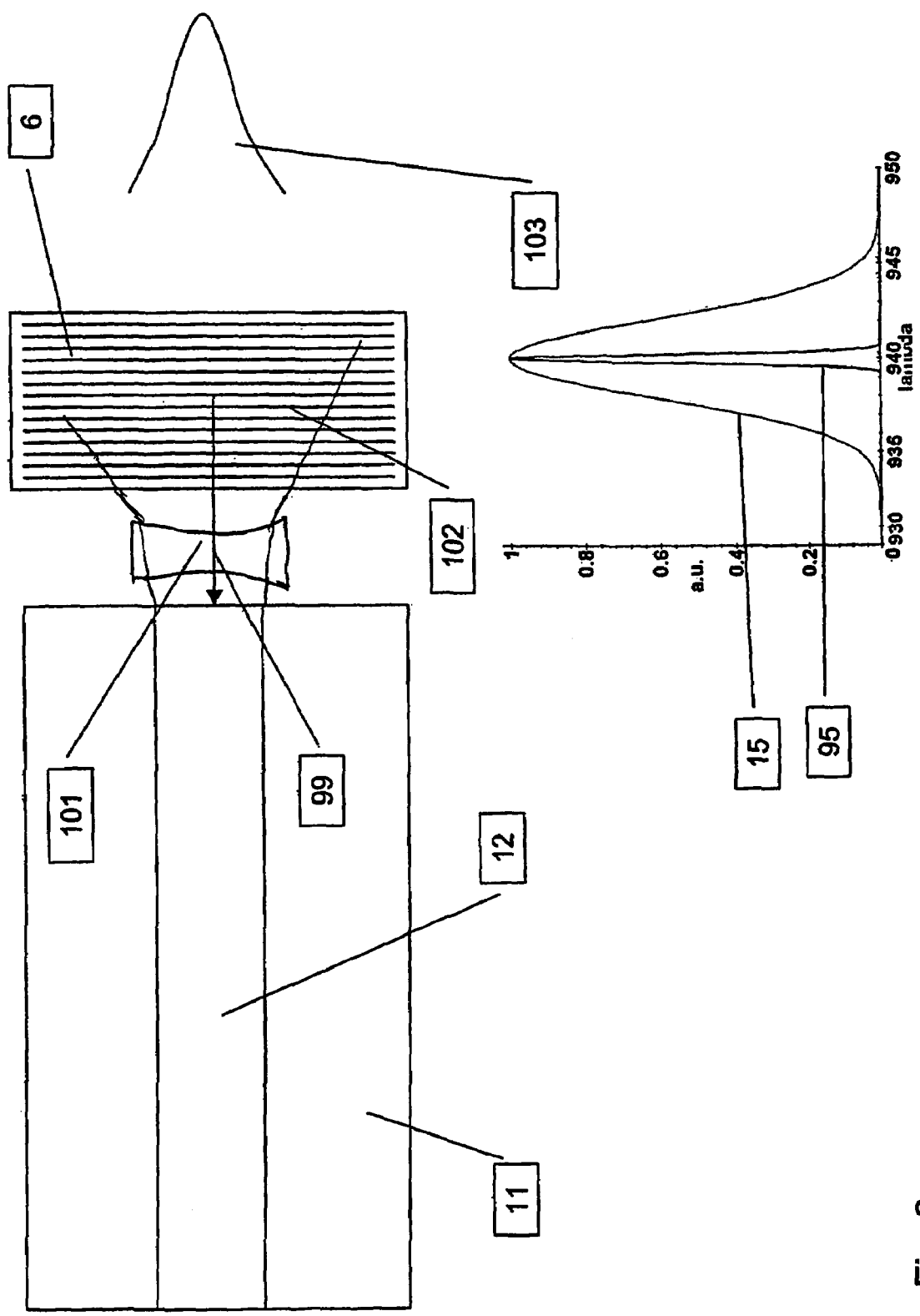
FIG. 8 is a schematic top view of a laser system, the lateral beam profile, and the output emission spectrum from the system.

As shown in FIG. 8, a slow axis lens 101 can be placed between laser 10 and reflector 404 to change the divergence angle of the different spatial modes in the slow axis, which can achieve additional reduction in feedback from reflector 404 for these higher order modes. Slow axis lens 101 can be a converging lens to collimate the beam or can be a diverging lens to enhance mode discrimination by the reflector 404. The slow axis lens 101 can be used alone or in combination with the fast axis lens 430. The optical effect of the two lenses 101 and 430 can also be combined into a single optical element that focuses (or defocuses) the output beam along both the fast and slow axes.

Similar to the reduction of spatial modes and reduction of divergence in the output beam profile, the narrow spectral bandwidth of the reflector 404 enhances feedback into the laser 10 for wavelengths that correspond to the spectral reflectivity spectrum of the reflector 404, thus discriminating spectral mode's that lie outside the reflectivity spectrum of the reflector 404. This line width of the radiation spectrum 95 emitted from the diode laser 10 and reflector 404 system is narrower than the spectrum 15 of radiation emitted from the diode laser 10 in the absence of the reflector 404. For example, the FWHM line width of the spectrum 95 can be much less than 0.1 nanometer compared to the several nanometer wide spectrum 15. For example, the FWHM line width can be about $10^{-6}$ nm (i.e., 100 kHz).

Because the reflectivity spectrum of the VBG reflector 404 is relatively narrow and the intrinsic absorption of the VBG is small, relatively little radiation, and therefore heat, is absorbed in the reflector. In addition, the PTR glass of the reflector 404 does not experience Joule heating as the diode laser 10 does when driven by an electrical current, so optical properties of the reflector 404 are relatively thermally stable in comparison to the optical properties of the laser 10. Because of this, the reflectivity spectrum of the reflector 404 is relatively thermally stable compared to the spontaneous emission spectrum of the laser 10. Thus, the peak output wavelength, $\lambda_o$, of the laser-reflector system is not determined only by the thermally-sensitive peak of the spontaneous emission spectrum 302 of laser 10, but also by the thermally-stable, wavelength-dependent feedback from reflector 404. As a result, the peak wavelength of the diode laser 10 and reflector 404 system is relatively insensitive to the temperature of the system. For example, in the absence of reflector 404, the output wavelength of the diode laser 10 can shift from about 800 nm to about 812 nm as the temperature of the diode laser's environment rises from about 20° C. to about 55° C. When the reflector 404 provides feedback into the laser 10, the output wavelength of the diode laser 10 shifts by less than about 0.2 nm over this temperature range. The output wavelength of the diode laser 10 is similarly stabilized by the reflector 404 against age-induced drifts in the output wavelength. As another example, the presence of the reflector 404 can reduce the dependence of the peak wavelength on the drive current by a factor of about 2.5.

Figure 9:
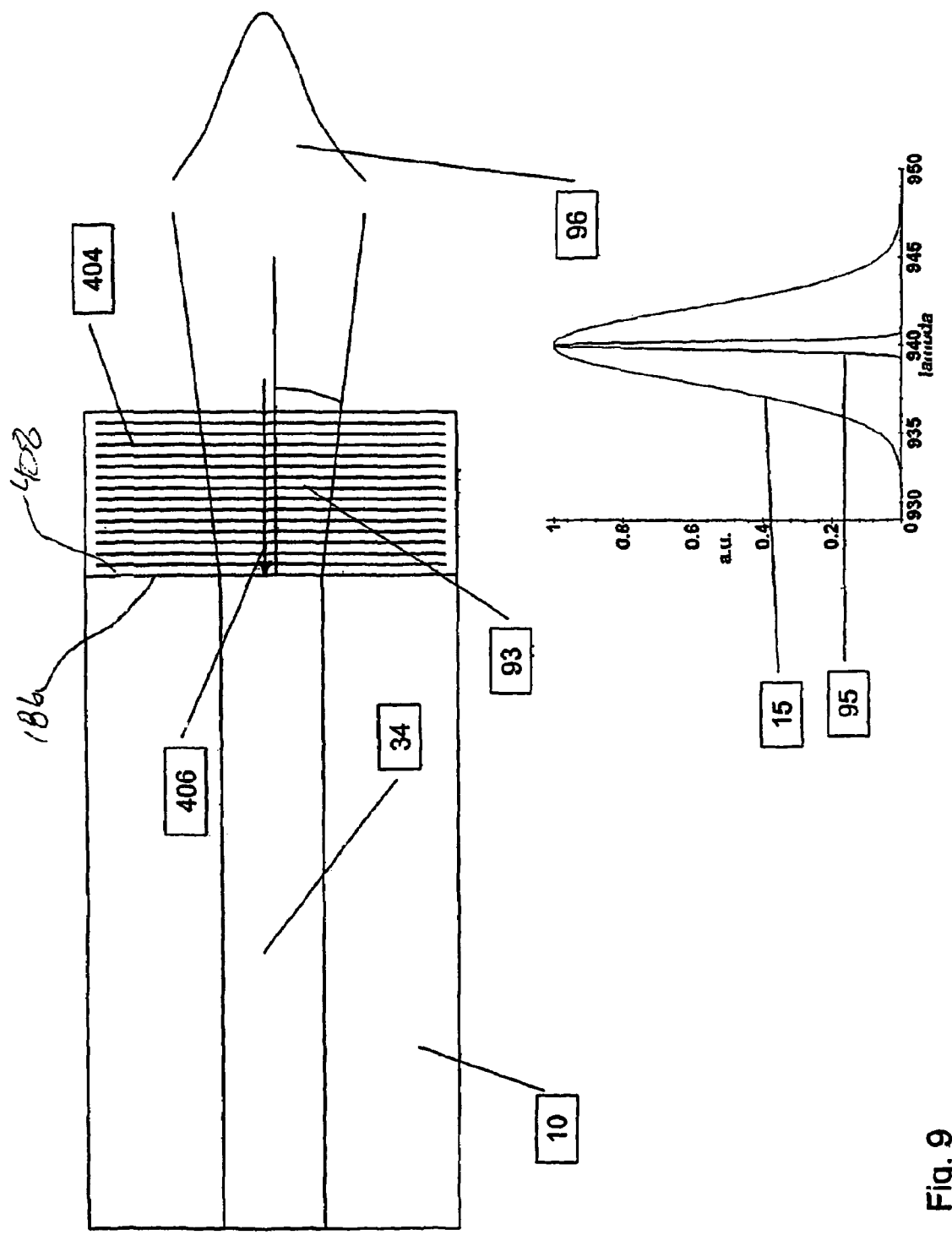
FIG. 9 is a schematic top view of a laser system, the lateral beam profile, and the output emission spectrum from the system.

As shown in FIG. 9, reflector 404 can be brought into direct contact with the diode laser 10. Direct contact between an end surface 18b of the laser 10 and the front surface 408 of the reflector 404 improves the spatial and spectral beam quality of the output laser radiation. In addition, when the laser 10 and reflector 404 are in direct ("optical") contact, heat removal from the laser facet is improved by providing an additional direction of solid-state conductive heat transport from the diode laser 10. Reduction of thermal stress to the end surfaces ("facet") 18a and 18b of the laser 10 may improve the catastrophic optical mirror damage (COMD) level of the diode laser 10. Good thermal contact can be achieved between an end surface 18 of the laser 10 and a VBG reflector 404 because both have optically flat surfaces that make good optical contact with each other.

Figure 10:
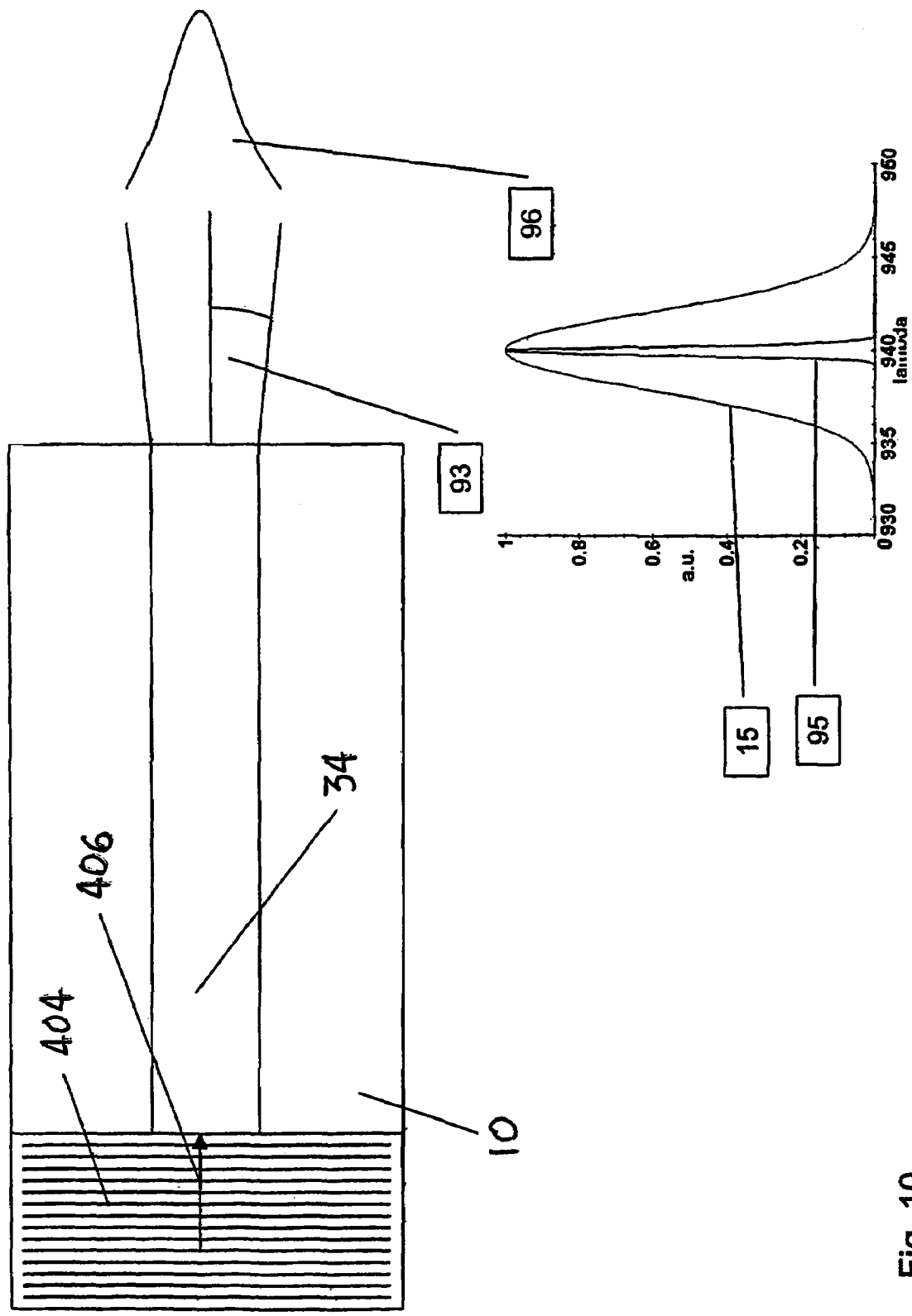
FIG. 10 is a schematic top view of a laser system, the lateral beam profile, and the output emission spectrum from the system.

As shown in FIG. 10, front surface 408 of the reflector 404 can be attached or placed close to the end surface 18a of the laser 10, such that the reflector acts as the rear mirror of the laser 10. In this case the facet reflectivity of the end surface 18a of laser 10 can be chosen to be at least semi-transparent, if not totally transparent, while the reflector 404 having a reflectivity peak at the desired angle and wavelength of about 95% or more will ensure maximum reflection and feedback 406 of the beam. The angular and spectral selectivity will again proficiently ensure the discrimination of high order spatial modes and decrease the spectral line width from its original shape 15 to the narrow shape 95.

By tailoring the effective reflectivity of the front surface 408 and the reflector 404, different operational configurations can be achieved. An injection-locking or self-seeding configuration is achieved when both the front surface 408 and the reflector 404 provide significant feedback into the device. In this case high efficiency (and high power) is achieved with decreased spectral or spatial stability. In contrast, an external cavity laser configuration is achieved when only the reflector 404 provides significant feedback into the device. In this case, the highest spectral or spatial stability is achieved, but with lower efficiency (and power).

Figure 11:
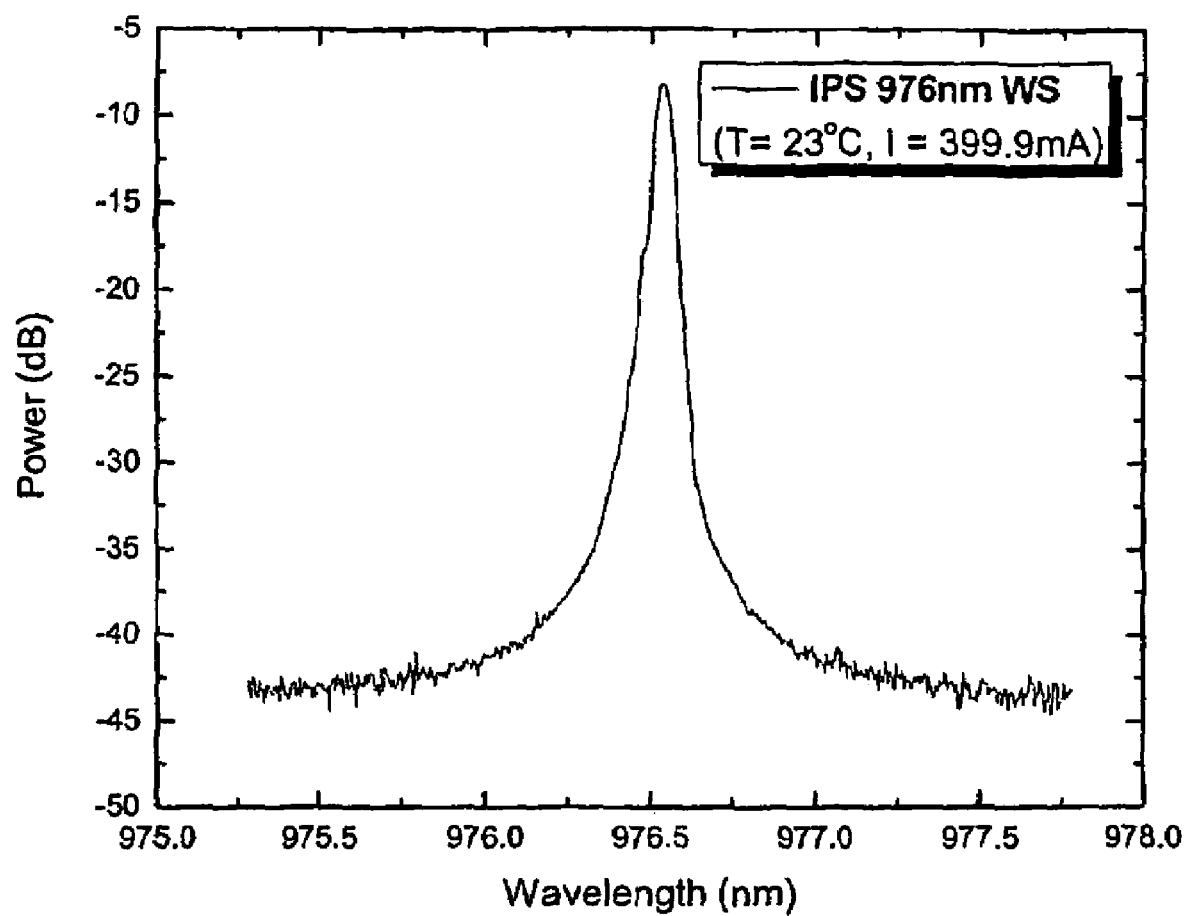
FIG. 11 is a graph of a single longitudinal mode spectrum of a diode laser formed with a volume bragg grating in a compact ECL configuration.

Traditional external cavity laser ("ECL") designs have a large physical spacing between the laser and the output coupling mirror. This leads to very narrow longitudinal mode spacing. With the close proximity of the reflector 404 described above to the diode laser 10, it is possible to increase the longitudinal mode spacing and decrease the spectral linewidth of the output beam, such that a single longitudinal mode operation is achieved, as shown in FIG. 11. This allows a small footprint, robust ECL with more than −30 dB side mode suppression compared with a Fabry-Perot laser and 0.01 nm/C temperature stability. For example, the footprint of the ECL can be less than about one square centimeter, and can have a sidemode suppression ratio ("SMSR") of greater than −30 dB and can have a temperature stability of less than 0.01 nm/C.

The narrow linewidth output beam from such a semiconductor diode laser 10 and reflector 404 arrangement also permits efficient wavelength division multiplexing ("WDM"). Single mode line widths of less than $10^{-6}$ nm (i.e., 100 kHz) have been achieved.

As mentioned above, the lateral mode profile is influenced by diode laser geometry, material system, temperature, and current distribution. It is also possible to selectively tailor and stabilize both the vertical and lateral spatial modes of a device for specific applications with an external reflector 404. For example, a top-hat-shaped far-field emission pattern can be desirable for printing applications. This can be achieved by designing the reflector 404 to selectively feedback only the fundamental and second order spatial modes for either or both the vertical and lateral laser modes. In addition, the stabilization of the spatial mode structure leads to decreased filamentation in the output beam (i.e., more uniform illumination), reduced spatial hole burning within the gain medium, increased threshold at which COMD occurs, and reduced peak-to-valley variations in the near- and far-field beam profiles.

Figure 12:
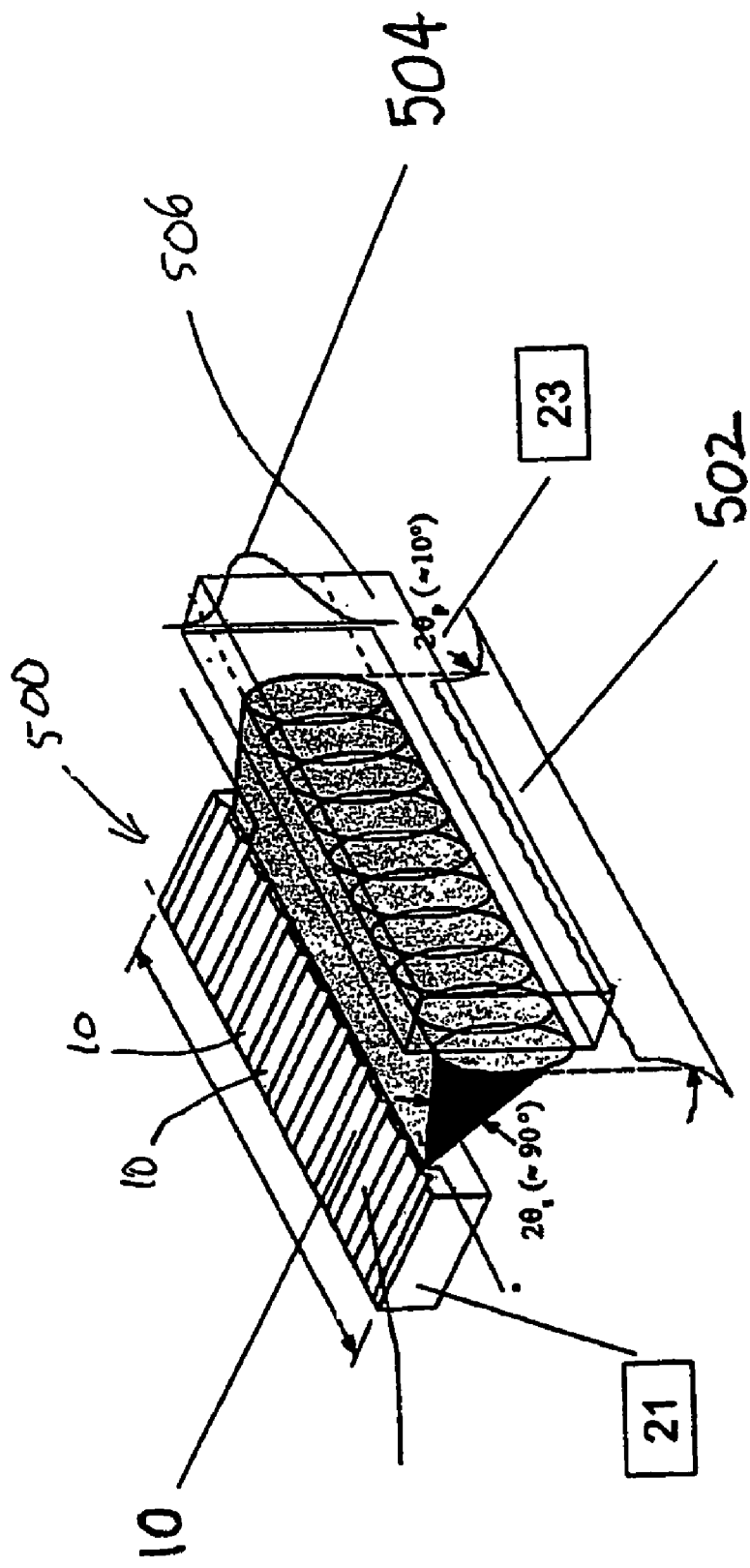
FIG. 12 is a schematic perspective view of a laser array system.

FIG. 12 shows an array 500 of broad stripe emitters 10 having a slow-axis far-field intensity profile 502 and a fast-axis far-field intensity profile 504 in optical communication with a narrow bandwidth reflector 506 that extends along the lateral width of the entire array. As with the single diode laser 10 and reflector 404 system described above, the array 500 and narrow bandwidth reflector 506 cause selective feedback to the individual emitters 10 of the array 500, which results in improved thermal stability of the peak wavelength of the array 500, a narrower vertical divergence angle of light from the array, and improved beam quality of light from the array.

Several arrays 500 of broad stripe emitters 10 can be stacked on top of each other to create a high power diode laser stack. Typically, 12 arrays 500 are stacked on top of each other with a vertical height of the stack being about 2 mm. Such a stack can capable of emitting 600 Watts of continuous output laser power. The individual arrays 500 of the stack can be fast-axis collimated, just like the individual arrays.

As with the single diode laser 10 and reflector 404 system described above, the stack of arrays 500 can be combined with a reflector 506 that extends over the entire height of the stack. This will cause selective feedback to the entire stack of arrays 500, resulting in improved thermal stability of the peak wavelength of the stack of arrays 500, a narrower vertical divergence angle of light from the stack of arrays, and improved beam quality of light form the stack of arrays 500.

The diode laser 10 and narrow spectral and spatial bandwidth reflector 404 system achieve a simultaneous improvement in spatial beam quality of the output beam and the reduction of the spectral width of the emitted radiation while maintaining the output to power of the laser 10 nearly constant, and therefore increase the brilliance of the diode laser 10.

Figure 13:
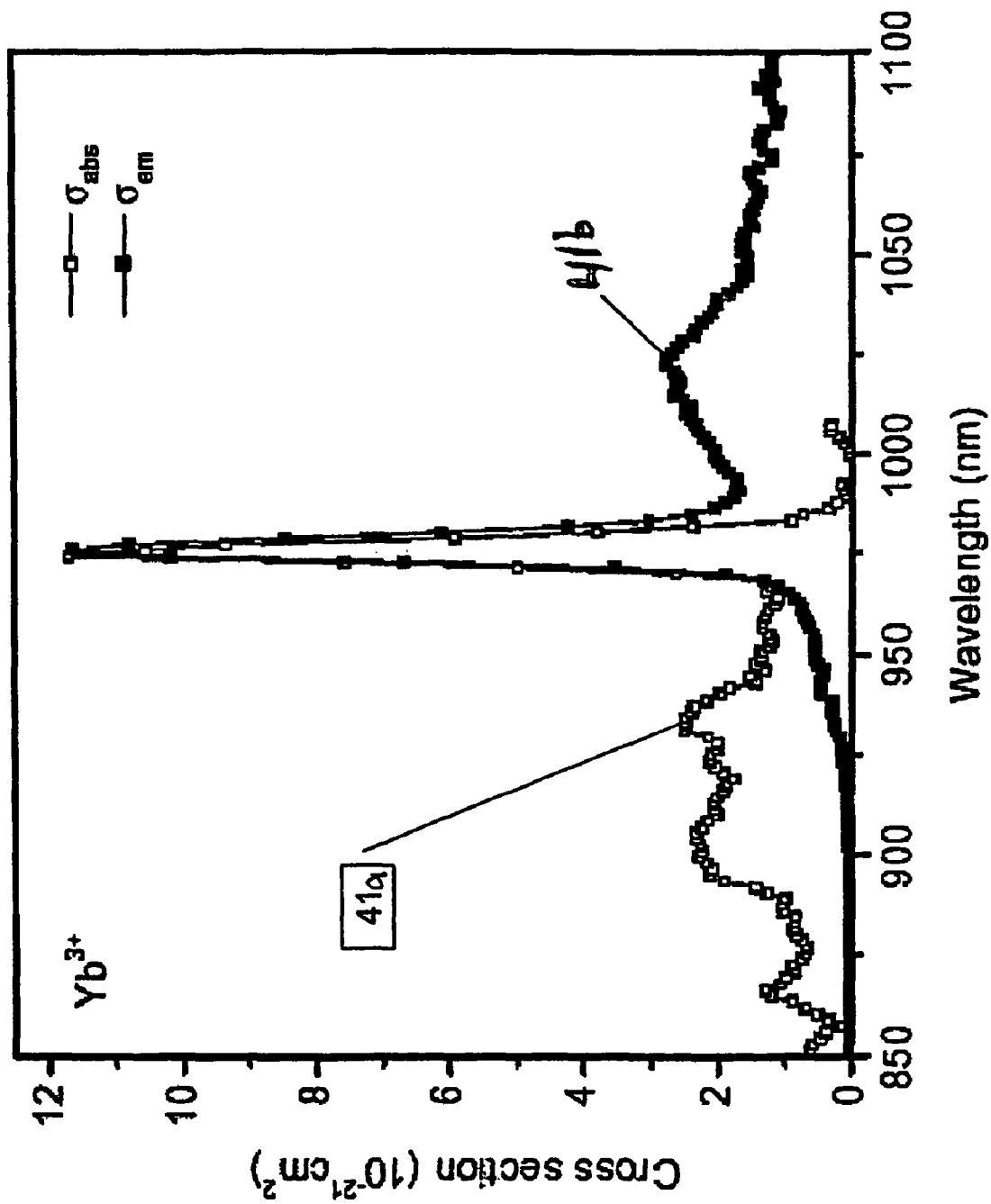
FIG. 13 is a graph of an absorption spectrum of a fiber laser medium.
Figure 14:
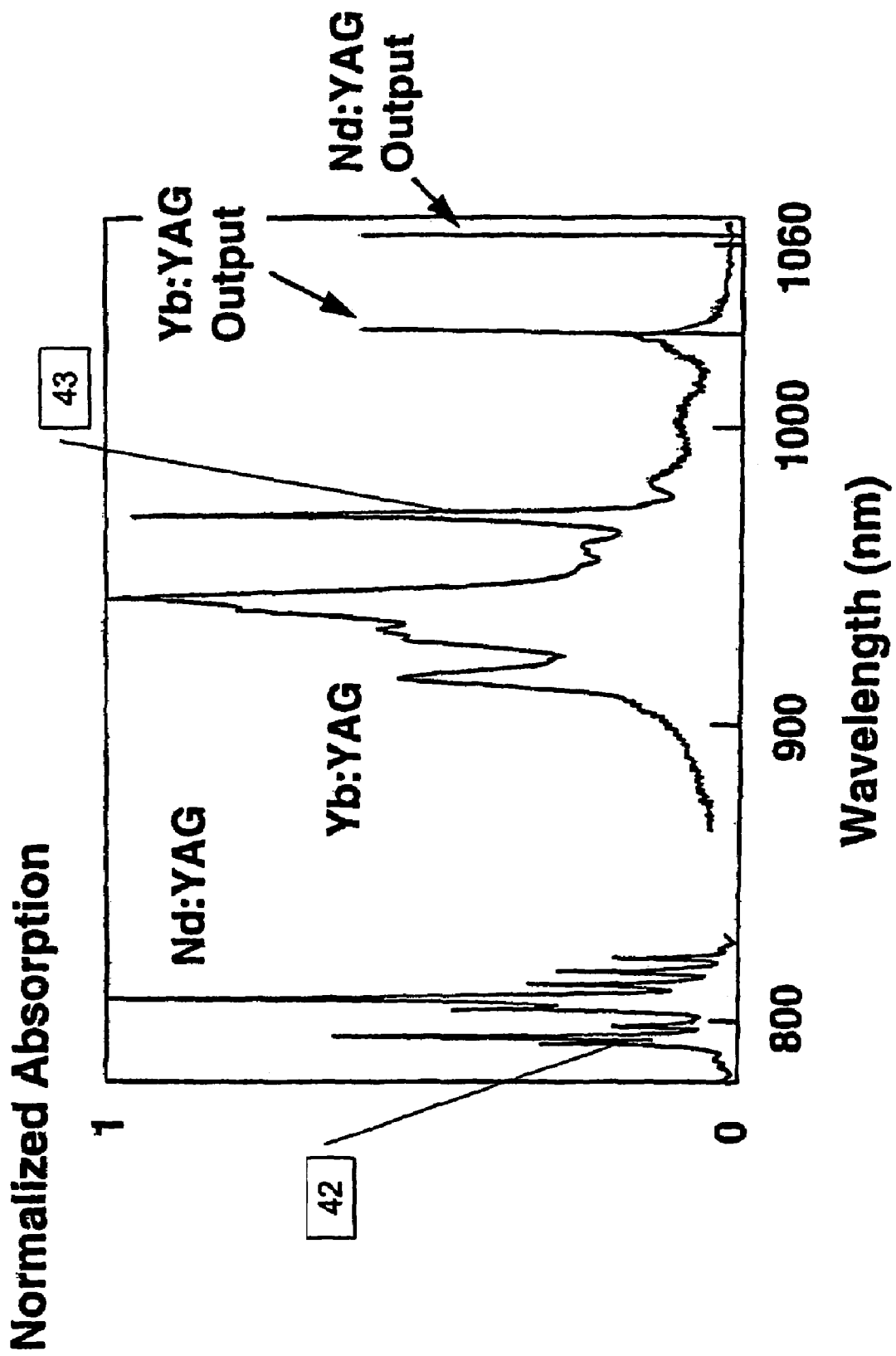
FIG. 14 is a graph of absorption spectra of laser media.

The combination of the diode laser 10 and the narrow bandwidth reflector 404 can be used to provide pump light to a solid state laser. For example, FIG. 13 shows an absorption spectrum 41a and an emission spectrum 41b of a Yb:Glass fiber laser, and FIG. 14 shows an absorption spectrum 42 of a Nd:YAG rod laser and an absorption spectrum 43 of a Yb:YAG disc laser. These three solid-state laser media are often used for high-power (e.g., multi-kW) laser applications. The laser media can be pumped with high-power diode lasers, however, the input pump power from the diode laser absorbed in the laser medium must exceed the output power from the solid state laser medium. Thus, to achieve multi-kW laser output from the solid state laser medium, the power of the pump diode laser must also be in the multi-kW range.

Figure 15B:
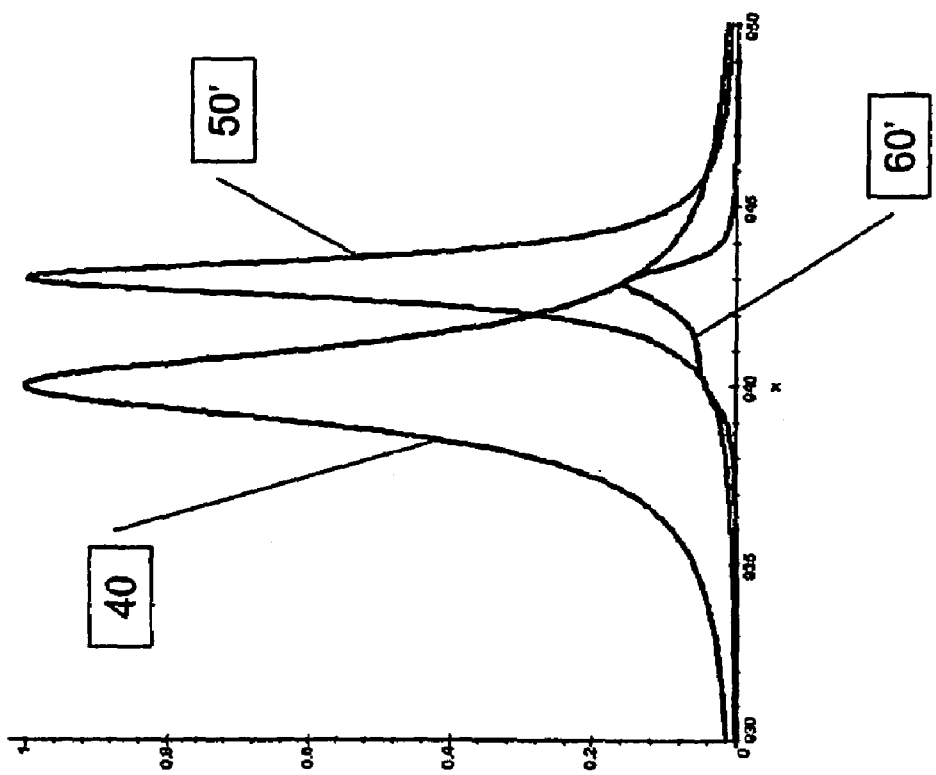
FIGS. 15a and 15b are graphs of an absorption spectrum of a laser medium and the emission spectrum of a diode laser.
Figure 15A:
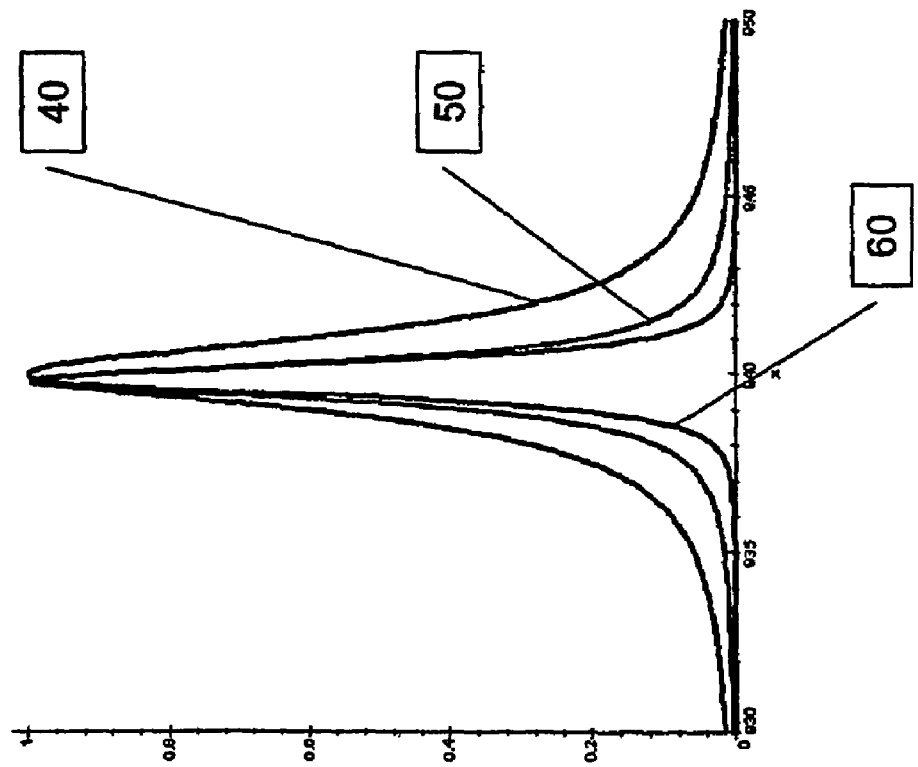

Referring to FIG. 15a, absorption of pump diode laser power depends on the overlap of the solid-state laser medium absorption line 40 and the emission line 50 of the pump diode laser. Absorption of pump diode laser power also depends on the absorption length of the pump radiation in the solid state laser medium. The integral of the overlap function 60 of the laser medium absorption line 40 and the pump laser emission line 50 is generally increased when the peak emission wavelength of the diode laser is approximately equal to the center wavelength of the absorption spectrum 50. The overlap integral also generally increases when the FWHM line width of the emission spectrum 40 is smaller or at most of equal to that of the absorption spectrum 50.

As shown in FIG. 15b, when the peak wavelength of the pump laser emission spectrum 50' differs from the center wavelength of the absorption spectrum 40 by a few nm, the integral of the overlap function 60' between the two spectra is rather poor, even though the line width of the emission spectrum 40 is smaller than that of the absorption spectrum 50. Many different effects can lead to a mismatch between the center wavelength of the absorption spectrum 40 of the diode laser and the center wavelength of the emission spectrum 50 of the pump diode laser and therefore reduce the optical-optical efficiency of a diode pumped solid-state lasers.

Figure 16:
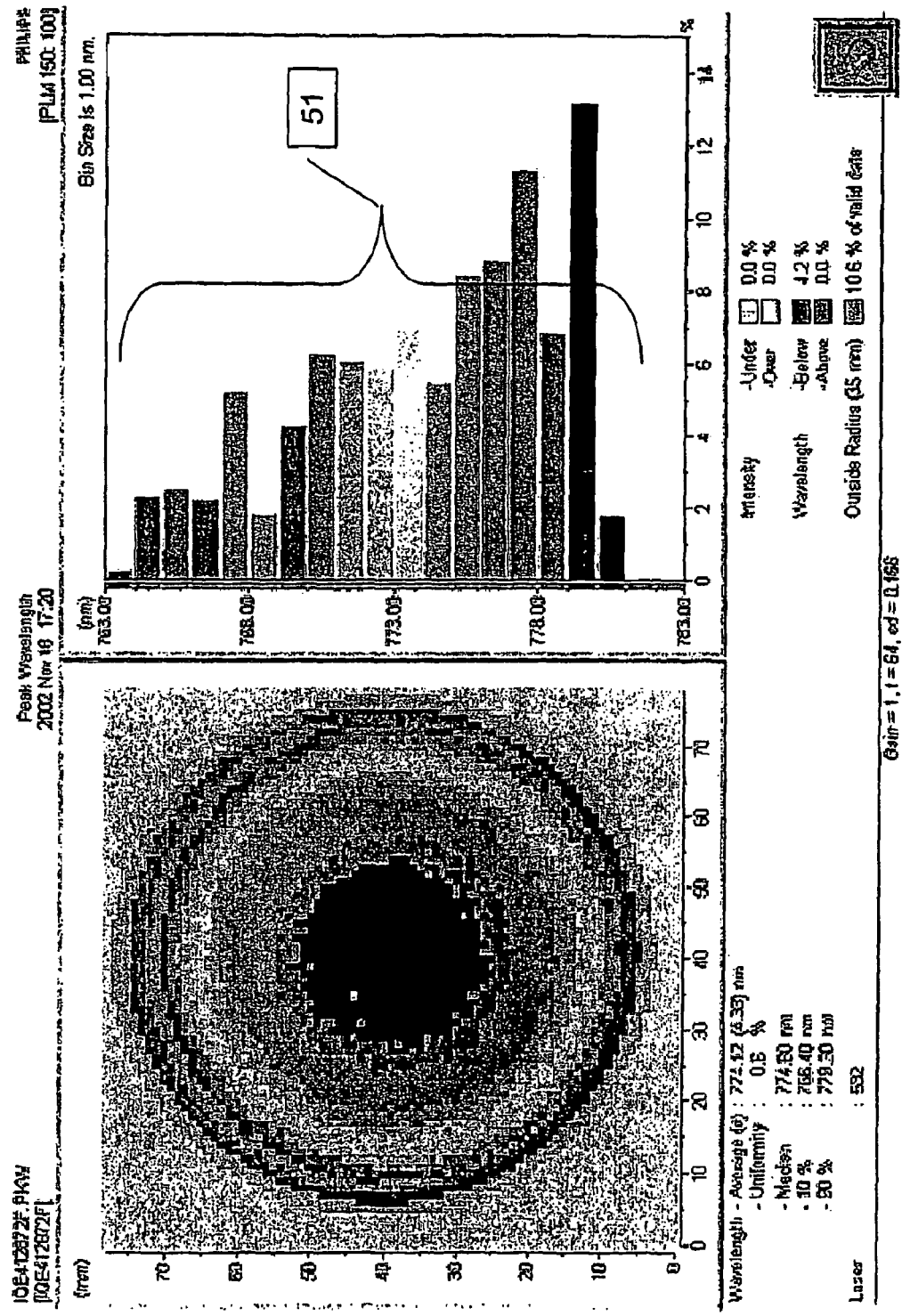
FIG. 16 is a graph of the center wavelength of a diode laser as a function of the diode lasers position on a semiconductor wafer.

For example, as shown in FIG. 16, when many diode lasers are created from a single semiconductor wafer, the center wavelength of a diode laser can depend on the position on the semiconductor wafer from which the diode laser is created because epitaxial growth does not occur entirely homogenously across the wafer. Generally, the wavelength of diode lasers produced near the center of a wafer is highest and diminishes for positions at greater radial distance from the center of the wafer. The wafer-position dependence of the peak wavelength of diode lasers produced from a three inch wafer can be about 20 nm, which, for diode lasers having emission spectrum line widths of a few nm, would render many lasers from the wafer useless for pumping a laser medium absorption line that is a few nm wide.

Figure 17:
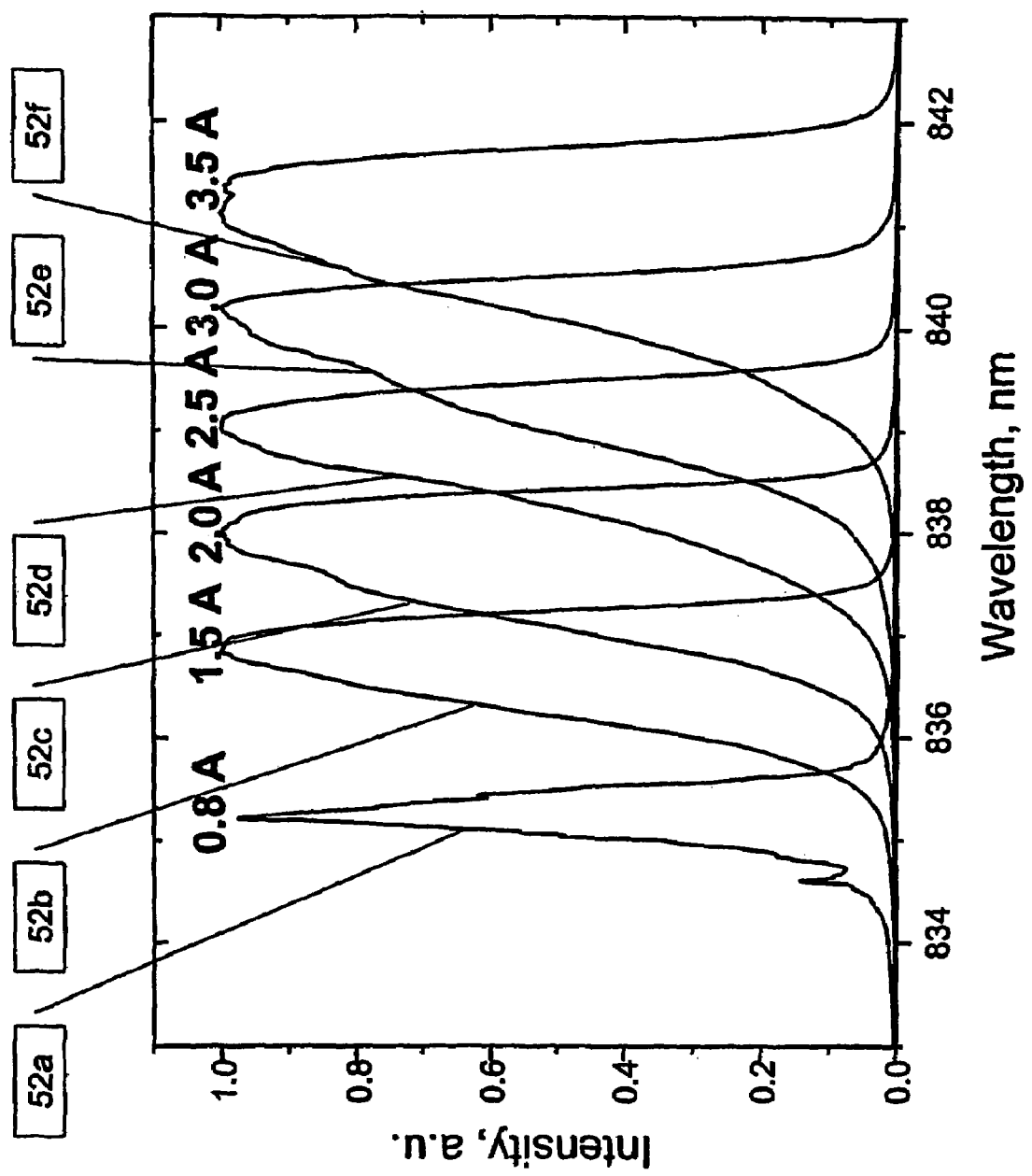
FIG. 17 is a graph of multiple diode laser emission spectra for different drive currents.

As another example, as shown in FIG. 17, the center wavelength and line width of the pump diode laser emission spectrum depends on the driving current and therefore on the output power from the pump laser. Characteristic emission spectra 52a, 52b, 52c, 52d, 52e, and 52f of a diode laser operated at 0.8 A, 1.5 A, 2.0 A, 2.5 A, 3.0 A, and 3.5 A, respectively, show that the peak wavelength of the diode laser can shift by more than 6 nm as the drive current is increased from 0.8 A to 3.5 A.

Figure 18:
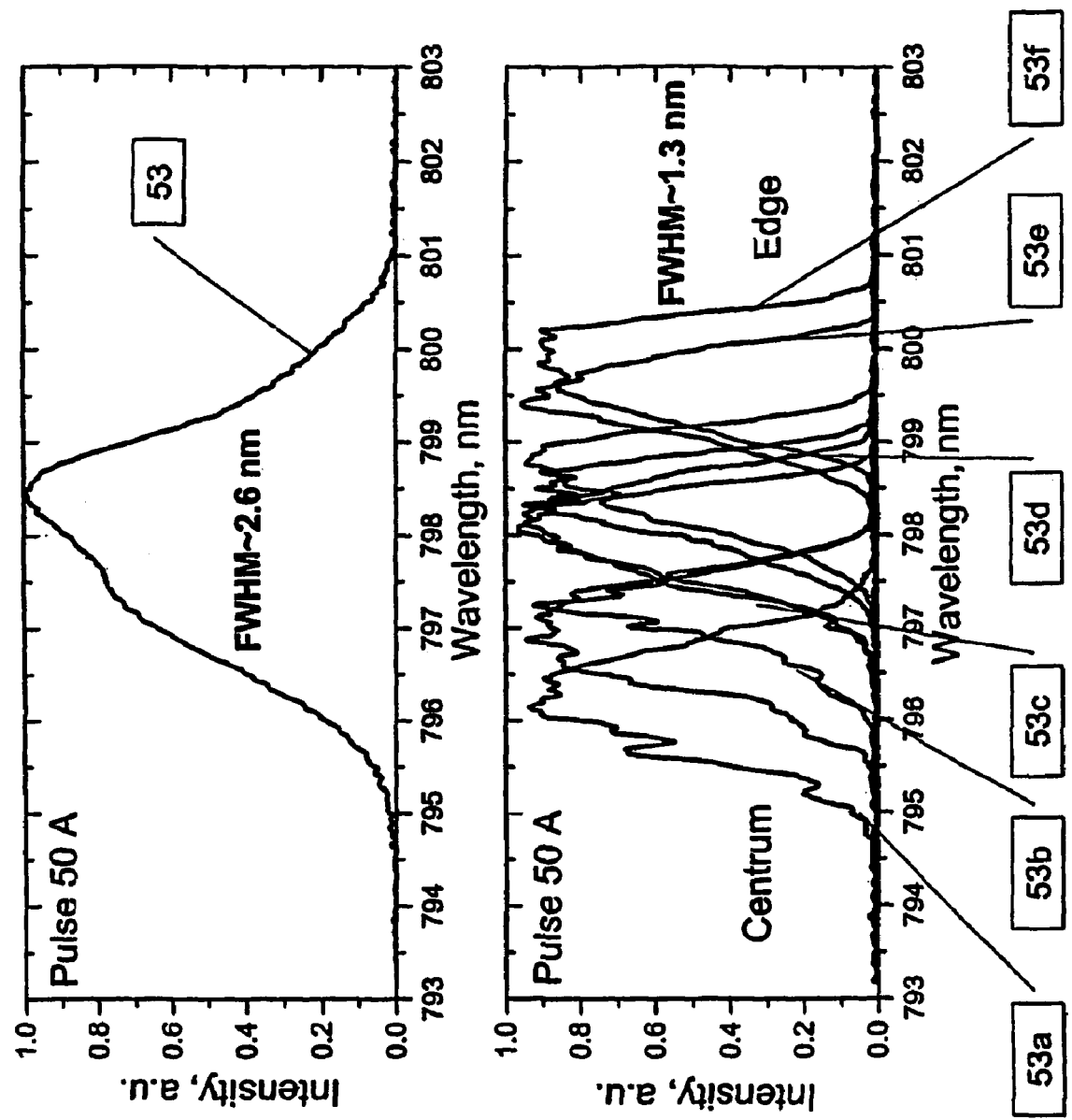
FIG. 18 is a graph of multiple diode laser emission spectra for different emitters in a diode laser array as a function of position.

As a further example, as shown in FIG. 18, the center wavelength of an individual emitter of an array can depend on the position of the emitter in the array (e.g., due to a stress-induced wavelength shift associated with the mounting of the array on a heat sink). Characteristic emission spectra 53a, 53b, 53c, 53d, 53e, and 53f of individual emitters located at different positions in the array show that the wavelength spectrum 53a of an emitter at the center of the array has a peak wavelength that is shorter that the peak wavelength of the spectrum 53f of an emitter located at an edge of the array. There is an additional difference in center wavelength between the emission spectrum at the left most emitter 53e and the right most emitter 53f. Thus, the combination of emission spectra from all individual emitters effectively causes line broadening of the emission spectrum (53) of the entire array.

All these effects affect the coupling efficiency between the input pump light and the output laser light in a diode pumped solid-state laser. However, stabilization of the pump diode laser wavelength by the narrow bandwidth reflector 404 reduces the deleterious aspects of these effects, by locking the emission wavelength of the high-power broad area stripe array of broad area or single mode stripes and stack of arrays to a specific central wavelength defined by the reflectance band of the reflector 404 and additionally narrowing the spectral line width of the pump radiation emission spectrum.

In addition to the improvement in spectral behavior, the improved beam quality of light from the diode laser—narrow bandwidth reflector system is favorable for solid state laser pumping because it allows a narrower focusing of the beam and therefore smaller solid state laser media (i.e., higher beam quality of the solid state laser) or much reduced alignment requirements between the pump beam and the laser medium.

Figure 19:
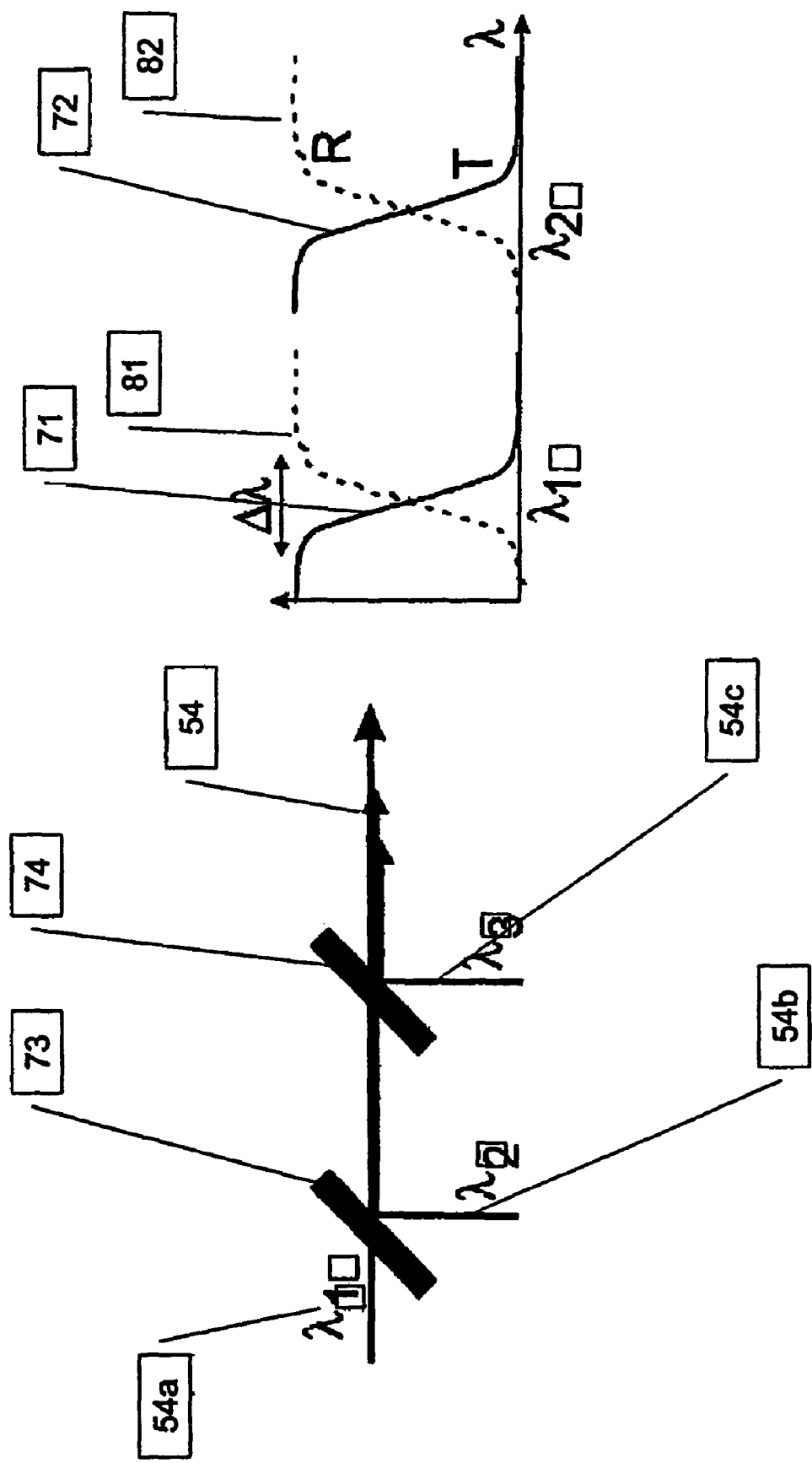
FIG. 19 is a schematic diagram of a system for combining different laser beams.

As shown in FIG. 19, several narrow bandwidth reflectors 73 and 74 can be used combine multiple laser beams 54a, 54b, and 54c having different wavelengths, $\lambda_1$, $\lambda_2$, and $\lambda_3$, respectively into a single beam 54. The reflectivity spectrum of the narrow bandwidth reflector 73 is selected to reflect beam 54b having wavelength $\lambda_2$ but to be transparent to beam 54a having wavelength $\lambda_1$. Similarly, the reflectivity spectrum of the narrow bandwidth reflector 74 is selected to reflect beam 54c having wavelength $\lambda_3$ but to be transparent to beams 54a and 54b having wavelengths $\lambda_1$ and $\lambda_2$, respectively. Although the beam is transparent scattering losses can occur leading to minor optical losses (~1%) for each reflector. Because the reflectivity spectra of the reflectors 73 and 74 are relatively narrow, the individual beams 54a, 54b, and 54c can be combined without sacrificing power or beam quality of the combined output beam 54.

High brightness diode laser sources may also be fabricated utilizing geometric, polarization, and spectral beam combining of multiple light sources described herein.

Figure 20:
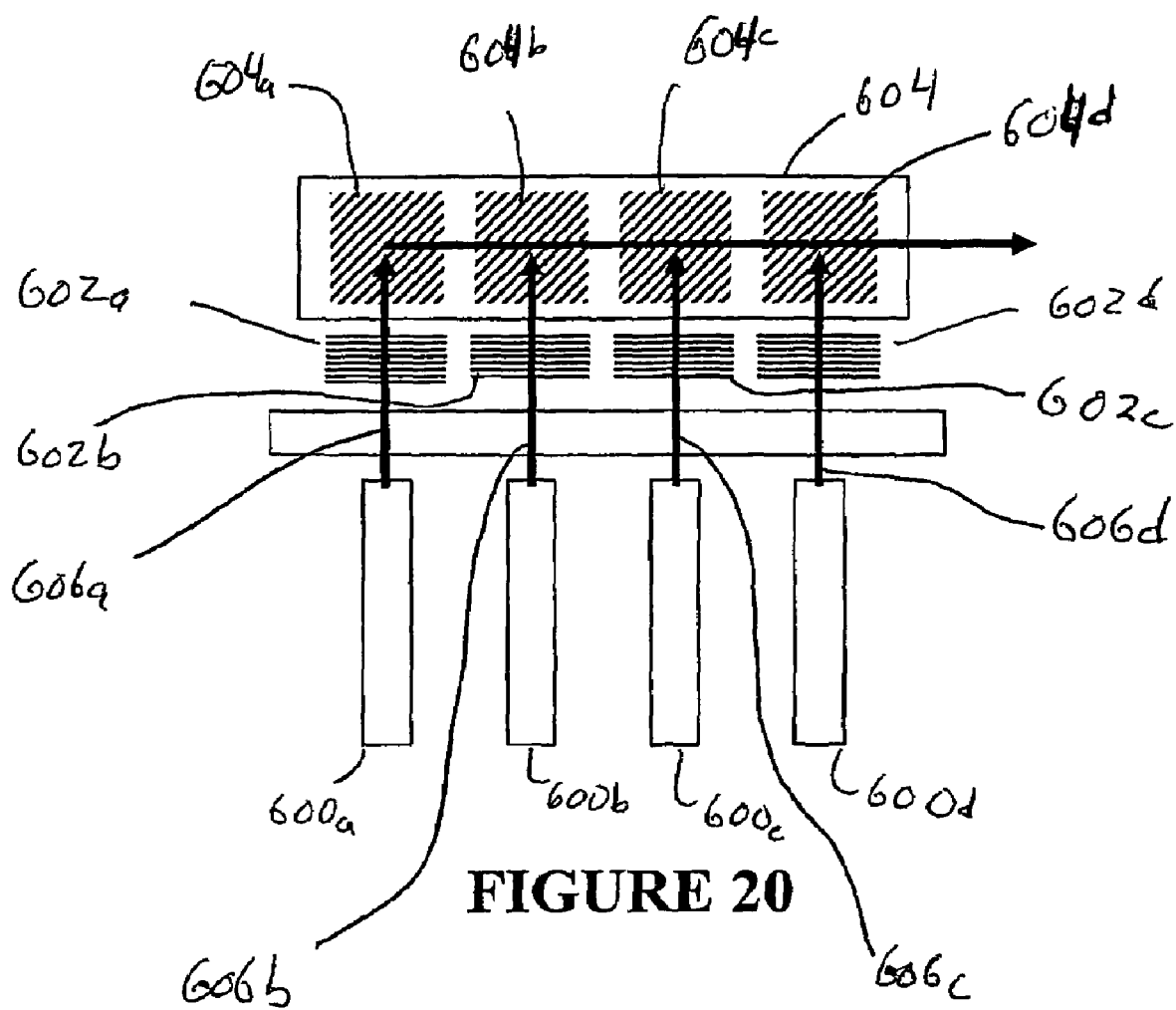
FIG. 20 is a schematic diagram of combining narrow bandwidth light sources using a series arrangement.

FIG. 20 illustrates an example of spectrally combining narrow bandwidth light sources 600 using a series arrangement. A reflector 602 or multiple reflectors 602a, 602b, 602c, and 602d provide feedback to the light sources that can narrow the spatial or spectral linewidth of output beam 602a, 602b, 602c, and 602d from the light sources 600. The outputs of the multiple light sources are combined through reflection with a volume Bragg grating 604, where each section 604a, 604b, 604c, and 604d of the grating is fabricated such that it reflects the wavelength that matches the corresponding light source 600a, 600b, 600c, and 600d but not wavelengths from emitted by other light sources.

Figure 21:
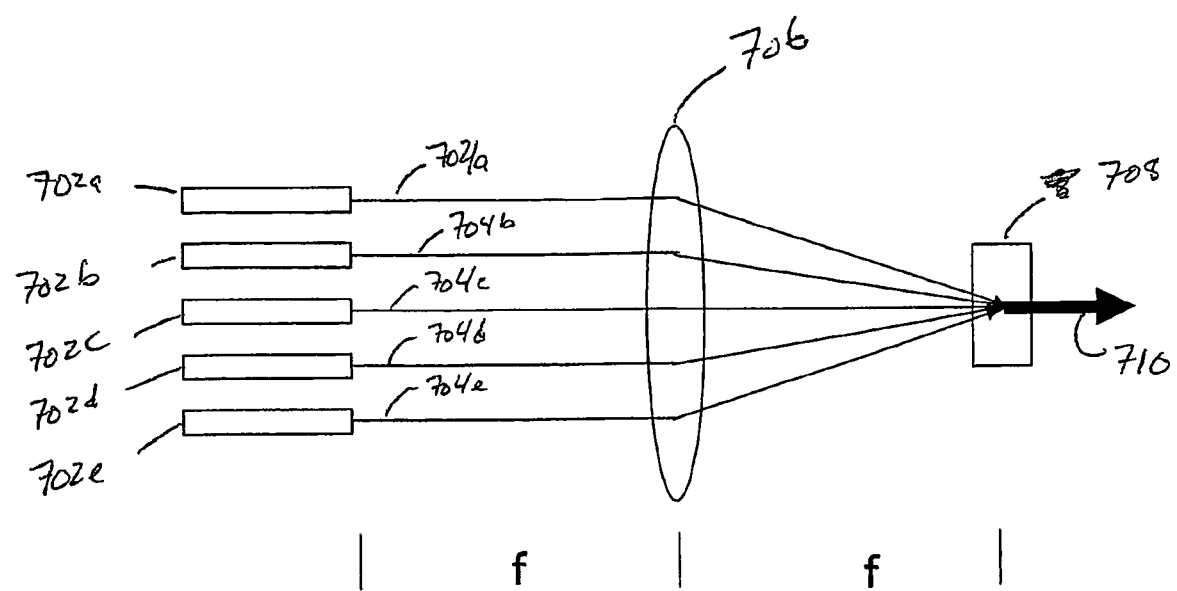
FIG. 21 is a schematic diagram of combining narrow bandwidth light sources using a parallel arrangement.

FIG. 21 illustrates an example of spectrally combining narrow bandwidth light sources 702a, 702b, 702c, 702d, and 702e having different optical properties (e.g., wavelength or polarization) using a parallel arrangement. Output beams 704a, 704b, 704c, 704d, and 704e from the narrow bandwidth light sources 702 are focused with a lens 706 onto a volume diffractive element 708 that refracts the beams by different amounts depending on the optical properties of the beams 704. Thus, the different beams can be combined into a single beam by the element 708.

In addition, it is possible to combine both series and parallel beam combining configurations in a two dimensional arrangement.

Other Embodiments

It is to be understood that while the invention has been described in conjunction with the detailed description thereof, the foregoing description is intended to illustrate and not limit the scope of the invention.

What is claimed is:

1. A light source comprising:
a first multi-spatial mode semiconductor diode laser;
a first reflector having a three-dimensional pattern of refractive index variations within the reflector, the first reflector being in optical communication with the first semiconductor diode laser and aligned with an output beam of the first laser such that a portion of the output beam of the first laser is reflected back into the first laser by the first reflector;
a second multi-spatial mode semiconductor diode laser;
a second reflector having a three-dimensional pattern of refractive index variations within the reflector, the second reflector being in optical communication with the second semiconductor diode laser and aligned with an output beam of the second laser such that a portion of the output beam of the second laser is reflected back into the second laser by the second reflector; and
a first beam combiner arranged to combine the output beams of the first laser and the second laser,
wherein the output beams of the first laser and the second laser have different polarizations.

2. The light source of claim 1, wherein the first beam combiner is external to cavities formed by first diode laser and the first reflector and by the second diode laser and the second reflector.

3. The light source of claim 1, wherein the first beam combiner is a reflector having a three-dimensional pattern of refractive index variations within the reflector.

4. The light source of claim 1, wherein the output beams of the first laser and the second laser have different wavelengths.

5. The light source of claim 1, further comprising:
a third semiconductor diode laser;
a third reflector having a three-dimensional pattern of refractive index variations within the reflector, the third reflector being in optical communication with the third semiconductor diode laser and aligned with an output beam of the third laser such that a portion of the output beam of the third laser is reflected back into the third laser by the third reflector; and a second beam combiner arranged to combine the output beams of the first laser and the third laser in parallel.

6. The light source of claim 1, wherein the first beam combiner, the first diode laser, and the second diode laser are arranged such that the beams are combined in parallel by the first beam combiner.

7. A light source comprising:

a first multi-spatial mode semiconductor diode laser;

a first reflector having a three-dimensional pattern of refractive index variations within the reflector, the first reflector being in optical communication with the first semiconductor diode laser and aligned with an output beam of the first laser such that a portion of the output beam of the first laser is reflected back into the first laser by the first reflector;

a second multi-spatial mode semiconductor diode laser;

a second separate reflector having a three-dimensional pattern of refractive index variations within the reflector, the second reflector being in optical communication with the second semiconductor diode laser and aligned with an output beam of the second laser such that a portion of the output beam of the second laser is reflected back into the second laser by the second reflector; and a first beam combiner arranged to combine the output beams of the first laser and the second laser, wherein the first beam combiner is a third separate reflector having a three-dimensional pattern of refractive index variations within the third reflector.

* * * * *

UNITED STATES PATENT AND TRADEMARK OFFICE
CERTIFICATE OF CORRECTION

PATENT NO. : 7,889,776 B2
APPLICATION NO. : 10/597300
DATED : February 15, 2011
INVENTOR(S) : Greg Charache et al.

It is certified that error appears in the above-identified patent and that said Letters Patent is hereby corrected as shown below:

Title Page, Item (57) please delete the Abstract and insert the following:

--ABSTRACT

A light source includes a semiconductor diode laser, and a reflector having a three-dimensional pattern of refractive index variations within the reflector. The reflector is in optical communication with the semiconductor diode laser and is aligned with an output beam of the diode laser, such that a portion of the light in the output beam is reflected back into the laser by the reflector.--

Signed and Sealed this
Third Day of May, 2011

David J. Kappos
*Director of the United States Patent and Trademark Office*